United States Patent
Kutsukake et al.

(10) Patent No.: US 11,302,696 B2
(45) Date of Patent: Apr. 12, 2022

(54) SEMICONDUCTOR DEVICE AND METHOD OF MANUFACTURING SEMICONDUCTOR DEVICE

(71) Applicant: KIOXIA CORPORATION, Tokyo (JP)

(72) Inventors: Hiroyuki Kutsukake, Yokkaichi Mie (JP); Masayuki Akou, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/798,979

(22) Filed: Feb. 24, 2020

(65) Prior Publication Data
US 2021/0066296 A1    Mar. 4, 2021

(30) Foreign Application Priority Data
Aug. 26, 2019    (JP) .............................. JP2019-153718

(51) Int. Cl.
*H01L 27/092*    (2006.01)
*H01L 29/417*    (2006.01)

(52) U.S. Cl.
CPC .... *H01L 27/0928* (2013.01); *H01L 29/41725* (2013.01)

(58) Field of Classification Search
CPC ........... H01L 27/0928; H01L 29/41725; H01L 21/76232; H01L 21/76237; H01L 29/0649
See application file for complete search history.

(56) References Cited

U.S. PATENT DOCUMENTS

| | | | | |
|---|---|---|---|---|
| 5,739,593 A | * | 4/1998 | Hayama | G09G 3/3696 307/43 |
| 6,495,890 B1 | * | 12/2002 | Ono | H01L 21/28035 257/386 |
| 2016/0308534 A1 | * | 10/2016 | Yamaji | H01L 29/0649 |
| 2017/0213827 A1 | * | 7/2017 | Kutsukake | H01L 29/0692 |
| 2019/0052230 A1 | * | 2/2019 | Shimamune | H03F 3/45183 |

FOREIGN PATENT DOCUMENTS

JP        2017-130608 A    7/2017

* cited by examiner

*Primary Examiner* — Stephen M Bradley
*Assistant Examiner* — Wasiul Haider
(74) *Attorney, Agent, or Firm* — Foley & Lardner LLP

(57) ABSTRACT

A semiconductor device includes: two first semiconductor regions of a first conductivity type spaced apart from each other; a second semiconductor region of a second conductivity type provided between the two first semiconductor regions; a first insulator region surrounding the two first semiconductor regions and the second semiconductor region; a third semiconductor region of the second conductivity type; a fourth semiconductor region of the second conductivity type, the fourth semiconductor region surrounding the third semiconductor region and the first insulator region and having an impurity concentration of the second conductivity type lower than an impurity concentration of the third semiconductor region; a second insulator region that surrounds the fourth semiconductor region; a conductor layer provided over the second semiconductor region; two first contact plugs; a second contact plug provided on the conductor layer; and a third contact plug provided on the third semiconductor region.

6 Claims, 31 Drawing Sheets

US 11,302,696 B2

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-153718, filed on Aug. 26, 2019, the entire contents of which are incorporated herein by reference.

FIELD

Embodiments described herein relate generally to a semiconductor device and a method of manufacturing the semiconductor device.

BACKGROUND

A MOS transistor formed on a semiconductor substrate is known. In a semiconductor device such as the MOS transistor, a p-type MOS transistor and an n-type transistor are arranged side by side.

Examples of related art include JP-A-2017-130608.

DETAILED DESCRIPTION

Figure 1:
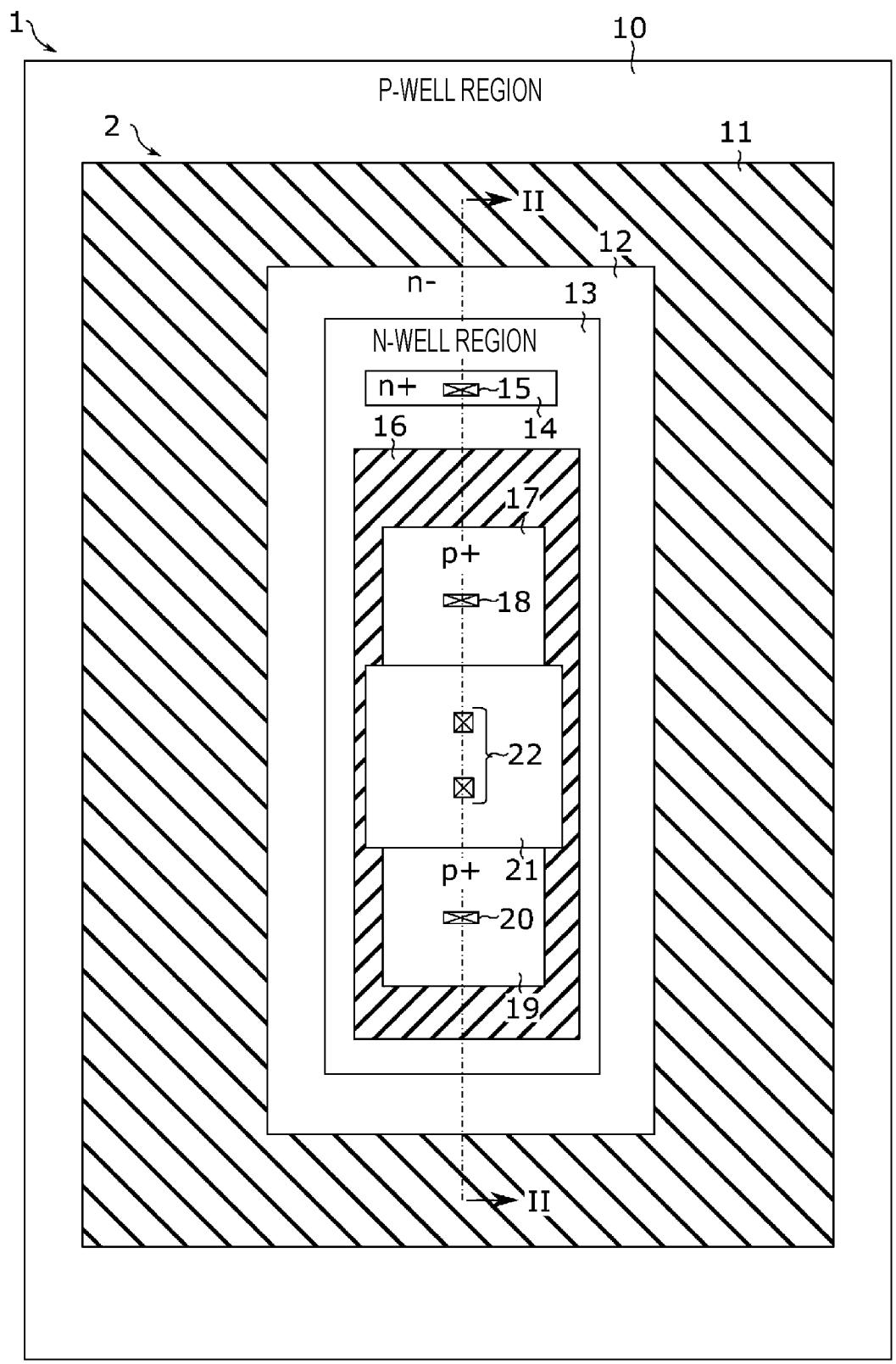
FIG. 1 is a plan view of a p-type transistor in a semiconductor device according to a first embodiment as viewed from above.

Embodiments provide reducing an element area while preventing deterioration of the well breakdown voltage of a transistor.

In general, according to one embodiment, the semiconductor device includes a substrate. The substrate includes: two first semiconductor regions of a first conductivity type spaced apart from each other in a first direction on the substrate; a second semiconductor region of a second conductivity type provided between the two first semiconductor regions; a first insulator region surrounding the two first semiconductor regions and the second semiconductor region; a third semiconductor region of the second conductivity type provided in the first direction adjacent to the first insulator region; a fourth semiconductor region of the second conductivity type, the fourth semiconductor region surrounding the third semiconductor region and the first insulator region and having an impurity concentration of the second conductivity type lower than an impurity concentration of the third semiconductor region. The semiconductor device further includes: a second insulator region that surrounds the fourth semiconductor region; a conductor layer provided over the second semiconductor region; two first contact plugs respectively provided on the two first semiconductor regions; a second contact plug provided on the conductor layer; and a third contact plug provided on the third semiconductor region.

Embodiments will be described below with reference to the drawings. Each embodiment exemplifies an apparatus and a method for embodying the technical idea of the disclosure. The drawings are schematic or conceptual, and the dimensions and ratios of the drawings are not necessarily the same as actual ones. The technical idea of the present disclosure is not specified by the shape, structure, arrangement, etc. of the elements.

Further, in the following description, components having substantially the same functions and configurations are denoted by the same reference numerals. The numbers after the letters that constitute the reference numerals are referenced by the reference numerals that contain the same letters and are used to distinguish between elements that have a similar configuration. When it is not necessary to distinguish between elements indicated by reference numerals containing the same letters, each of these elements is referenced by a reference numeral containing only the letters.

1. First Embodiment

The semiconductor device according to a first embodiment will be described.

1.1 Configuration

First, the configuration of the semiconductor device according to the first embodiment will be described. The semiconductor device according to the first embodiment includes, for example, a plurality of metal oxide semiconductor (MOS) transistors formed on a semiconductor substrate. The plurality of MOS transistors include transistors having different conductivity types (i.e., an n-type transistor and a p-type transistor), and these transistors are arranged on a semiconductor substrate.

FIG. 1 is a plan view of a p-type transistor in the semiconductor device according to the first embodiment as viewed from above. Further, in the following drawings, an interlayer insulating film and the like on the semiconductor substrate are omitted as appropriate.

As illustrated in FIG. 1, the semiconductor device 1 includes a p-type transistor 2. The p-type transistor 2 is formed on a region surrounded by a p-type well region (P-well region) 10 of, for example, a semiconductor substrate (e.g., a p-type semiconductor substrate). For example, an n-type transistor (not illustrated) is formed in the P-well region 10.

A region surrounded by the P-well region 10 in the p-type semiconductor substrate is electrically isolated from the P-well region 10 by, for example, an insulator layer 11 that functions as an element isolation region. The region of the p-type transistor 2 may be defined by, for example, the size of the insulator layer 11.

An n-type well region (N-well region) 13 surrounded by an $n^-$ impurity diffusion region 12 is formed in a region surrounded by the insulator layer 11 in the p-type semiconductor substrate. The $n^-$ impurity diffusion region is a region into which n-type impurities such as phosphorus (P) or arsenic (As) are ion-implanted so as to have a concentration lower than that of the N-well region 13. The $n^-$ impurity diffusion region 12 is in contact with the insulator layer 11 and functions as a guard ring that prevents the breakdown voltage deterioration of the N-well region 13 that may be caused by a surrounding n-type transistor (not illustrated).

In the N-well region 13, an insulator layer 16 that functions as an element isolation region surrounding a part of the N-well region 13 is formed, and an $n^+$ impurity diffusion region 14 is formed outside the insulator layer 16. A conductive contact 15 is formed on the $n^+$ impurity diffusion region 14 to control the potential of N-well region 13. That is, the $n^+$ impurity diffusion region 14 functions as a region that controls the potential of the back gate of the p-type transistor 2.

In the N-well region 13 surrounded by the insulator layer 16, $p^+$ impurity diffusion regions 17 and 19 are formed apart from each other. The $p^+$ impurity diffusion region is, for example, a region in which p-type impurities such as boron (B) are ion-implanted at a concentration equal to that of the $n^+$ impurity diffusion region or a concentration higher than that of the $n^-$ impurity diffusion region. In the example of FIG. 1, the $p^+$ impurity diffusion region 17 is formed between the $n^+$ impurity diffusion region 14 and the $p^+$ impurity diffusion region 19.

Each of the $p^+$ impurity diffusion regions 17 and 19 functions as the source and drain (or the drain and source) of the p-type transistor 2. A region between the $p^+$ impurity diffusion regions 17 and 19 in the N-well region 13 functions as a channel region of the p-type transistor 2. That is, the $p^+$ impurity diffusion region 19 is separated from the $p^+$ impurity diffusion region 17 by the channel region and an insulator layer 16B.

A conductor layer 21 is formed above the region between the $p^+$ impurity diffusion regions 17 and 19 via a gate insulating film (not illustrated). The conductor layer 21 functions as the gate of the p-type transistor 2.

A contact 18 is formed on the $p^+$ impurity diffusion region 17 to control the potential of a first end of the p-type transistor 2, and a contact 20 is formed on the $p^+$ impurity diffusion region 19 to control the potential of a second end of the p-type transistor 2. Further, a contact 22 is formed on the conductor layer 21 to control the gate potential of the p-type transistor 2. For example, a plurality of contacts 22 (two in the example of FIG. 1) may be formed.

In the following description, the distance in the direction in which the $p^+$ impurity diffusion region 19, the conductor layer 21 (or the channel region), the $p^+$ impurity diffusion region 17, and the $n^+$ impurity diffusion region 14 are arranged with respect to the p-type transistor 2 is referred to as the "length" of the p-type transistor 2, and the length in the direction orthogonal to the length direction is referred to as the "width" of the p-type transistor 2.

That is, the $p^+$ impurity diffusion region 19, the conductor layer 21 (or the channel region), the $p^+$ impurity diffusion region 17, and the $n^+$ impurity diffusion region 14 are formed, for example, along the length direction of the p-type transistor 2 in this order.

Further, the region of the N-well region 13 that is aligned with the channel region along the length direction includes the n+ impurity diffusion region 14 and extends along the length direction without being sandwiched by the insulator layer 16.

Figure 2:
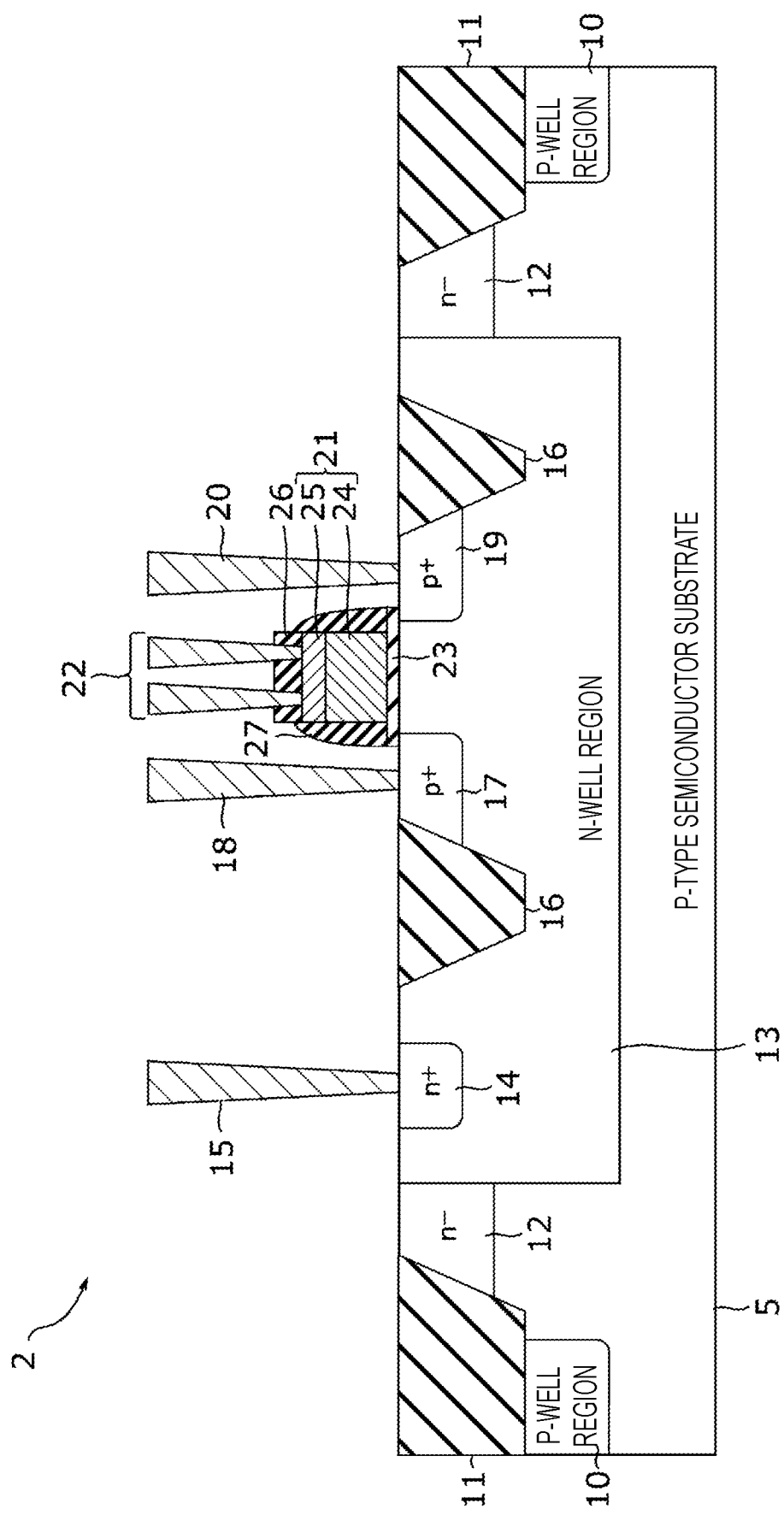
FIG. 2 is a cross-sectional view of a p-type transistor taken along line II-II in FIG. 1.

FIG. 2 is a cross-sectional view of the p-type transistor 2 along a straight line (line II-II in FIG. 1) extending in the length direction of the p-type transistor described above. In the following description, a direction from the portion of the p-type semiconductor substrate 5 where no well region is formed toward the surface of the p-type semiconductor substrate 5 is referred to as "upward," and the opposite direction is referred to as "downward." Further, the length from the surface of the p-type semiconductor substrate 5 downward is referred to as "depth."

As illustrated in FIG. 2, the P-well region 10 and the N-well region 13 are formed from the surface of the p-type semiconductor substrate 5 to a predetermined depth. A lower end of the insulator layer 11 is formed at a position shallower than a lower end of the P-well region 10, and the n− impurity diffusion region 12 is formed at a position shallower than the lower end of the insulator layer 11. The lower end of the insulator layer 16 is formed at a position shallower than the lower end of the N-well region 13, and the n+ impurity diffusion region 14 and the p+ impurity diffusion regions 17 and 19 are formed up to a position shallower than the lower end of the insulator layer 16. In addition, the insulator layers 11 and 16 are formed to, for example, an equivalent depth.

A gate insulating film 23 includes, for example, silicon oxide ($SiO_2$). A conductor layer 21 including conductor layers 24 and 25 is formed on the upper surface of the gate insulating film 23. The conductor layer 24 is formed on the upper surface of the gate insulating film 23 and includes, for example, polysilicon. The conductor layer 25 is formed on the upper surface of the conductor layer 24 and includes, for example, at least one conductive material selected from tungsten (W), tungsten silicide (WSi), cobalt silicide (CoSi), and nickel silicide (NiSi).

Insulator layers 26 and 27 are formed on the top and side surfaces of the conductor layer 21, respectively. The insulator layer 26 includes, for example, silicon nitride (SiN), and the insulator layer 27 includes, for example, silicon oxide ($SiO_2$).

1.2 Manufacturing Method

An example of a manufacturing process of the p-type transistor 2 in the semiconductor device according to the first embodiment will be described with reference to FIGS. 3 to 11. FIGS. 3 to 11 each represents an example of a cross-sectional structure that includes a structure corresponding to the p-type transistor 2 in the manufacturing process of the semiconductor device according to the first embodiment. Further, the cross-sectional view of the manufacturing process referred to below includes a section perpendicular to the surface of the p-type semiconductor substrate 5.

Figure 3:
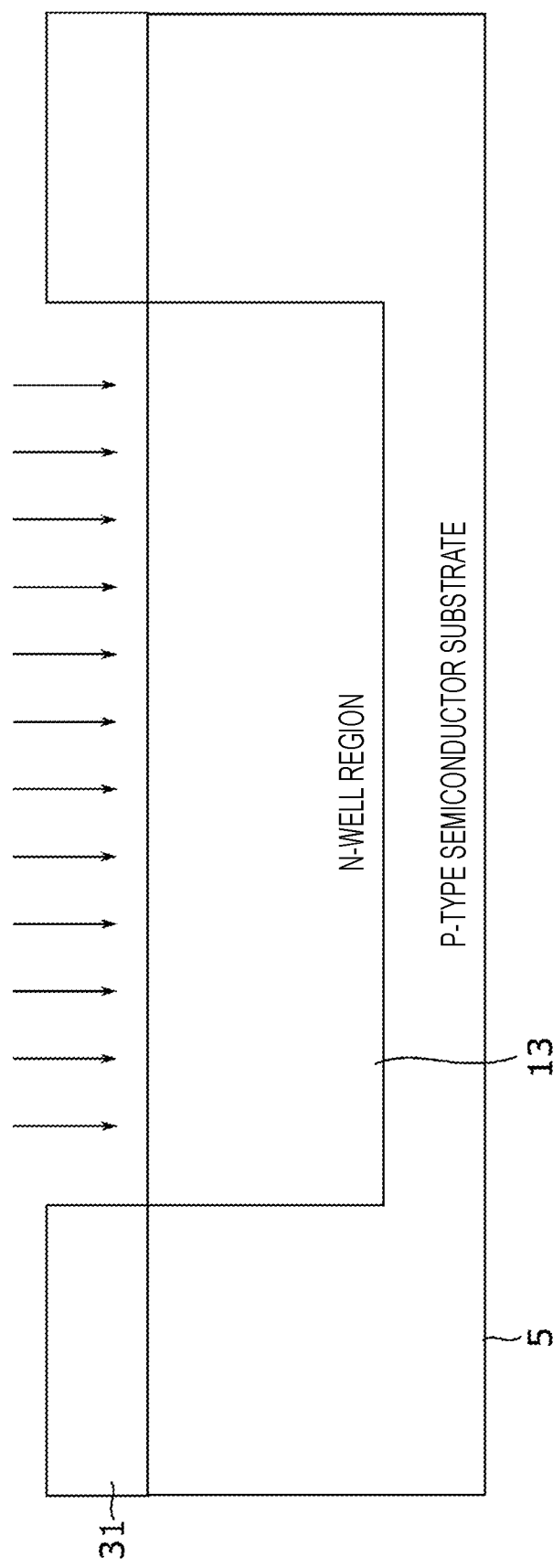
FIG. 3 is a cross-sectional view of a p-type transistor for illustrating a manufacturing process of the semiconductor device according to the first embodiment.

First, as illustrated in FIG. 3, a resist material 31 is formed on the p-type semiconductor substrate 5. A portion of the resist material 31 formed on a region where the N-well region 13 is to be formed is removed by, for example, photolithography, and the p-type semiconductor substrate 5 in the region is exposed. Then, n-type impurities are selectively ion-implanted into the exposed p-type semiconductor substrate 5 to form an N-well region 13. After the N-well region 13 is formed, the resist material 31 is removed.

Figure 4:
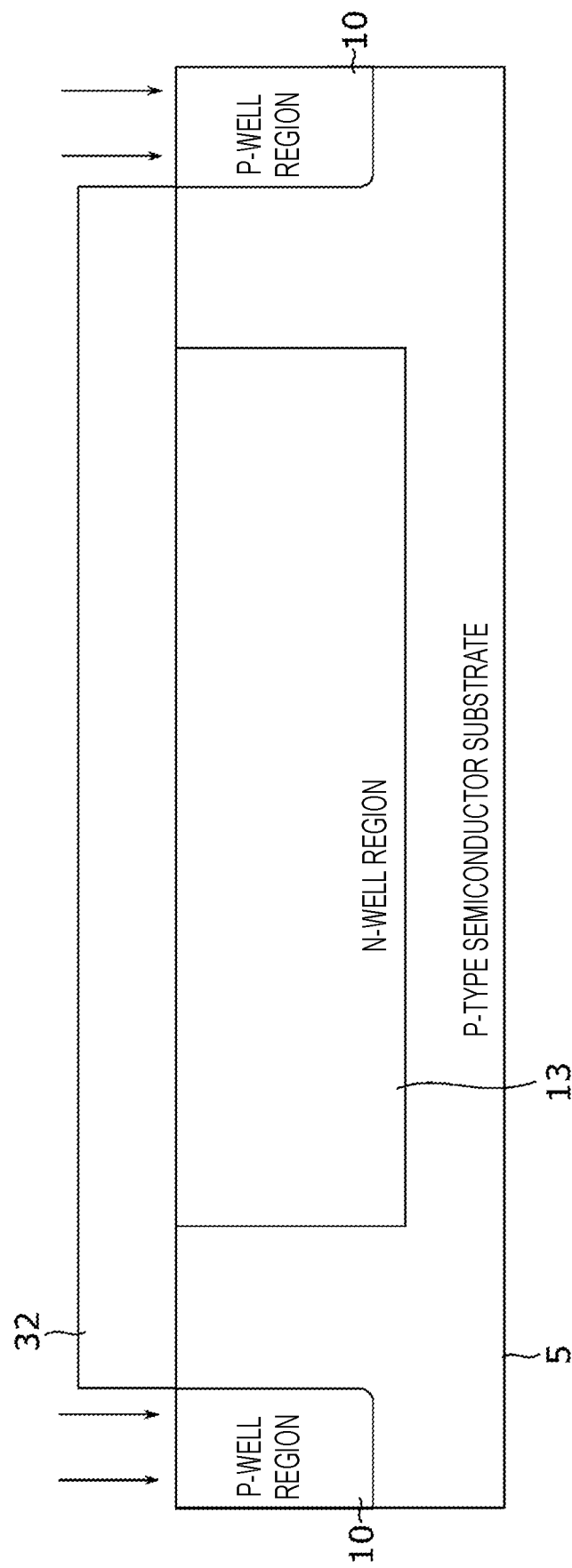
FIG. 4 is a cross-sectional view of a p-type transistor for illustrating a manufacturing process of the semiconductor device according to the first embodiment.

Next, as illustrated in FIG. 4, a resist material 32 is formed on the p-type semiconductor substrate 5. A portion of the resist material 32 formed on a region where the P-well region 10 is to be formed is removed by, for example, photolithography, and the p-type semiconductor substrate 5 in the region is exposed. Then, p-type impurities are selectively ion-implanted into the exposed p-type semiconductor substrate 5 to form a P-well region 10. After the P-well region 10 is formed, the resist material 32 is removed.

Figure 5:
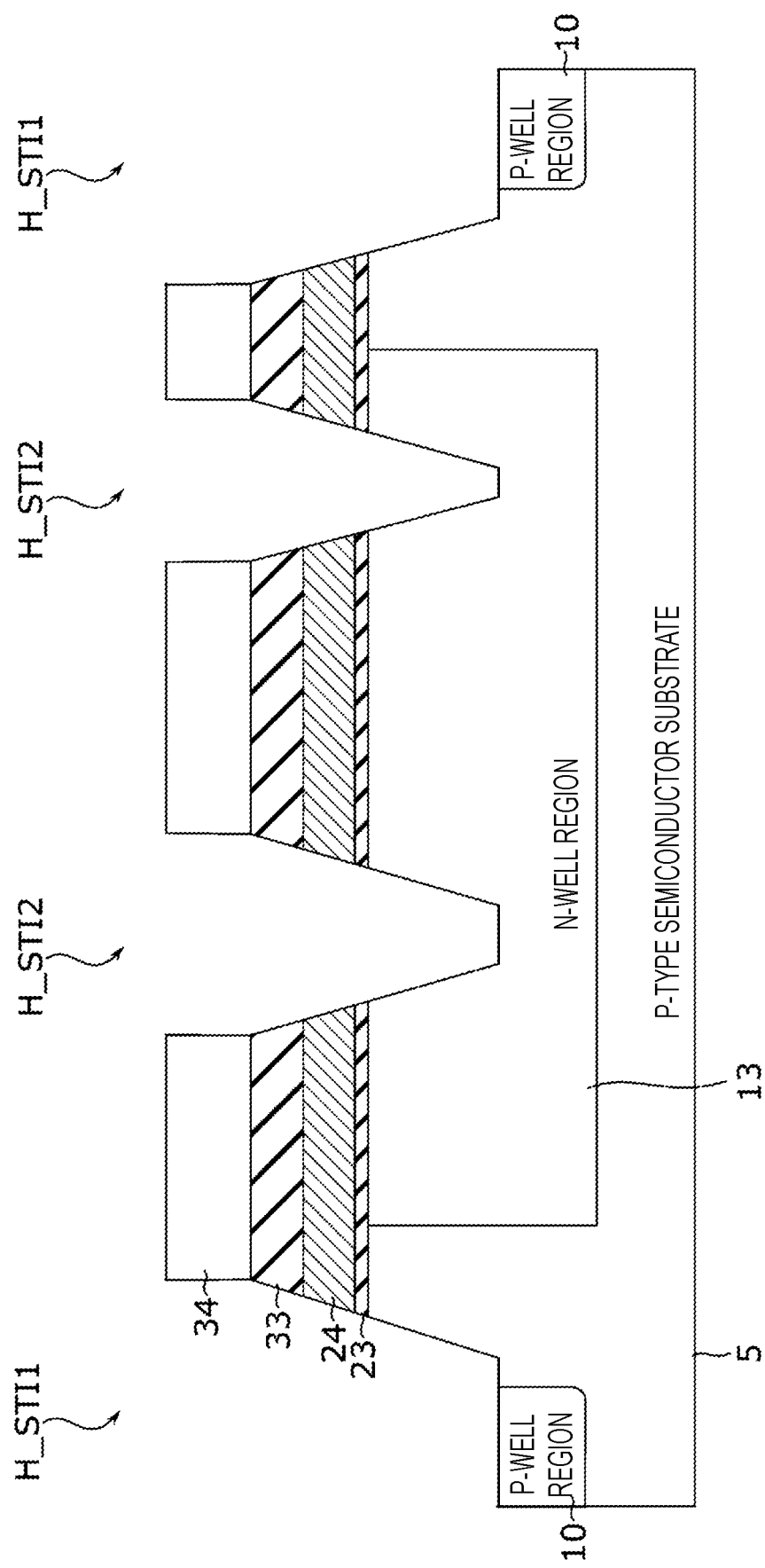
FIG. 5 is a cross-sectional view of a p-type transistor for illustrating a manufacturing process of the semiconductor device according to the first embodiment.

Next, as illustrated in FIG. 5, holes H_STI1 and H_STI2 are formed in regions where the insulator layers 11 and 16 are to be formed, respectively. Specifically, the gate insulating film 23, the conductor layer 24, a mask material 33, and a resist material 34 are sequentially stacked on the p-type semiconductor substrate 5 after the N-well region 13 and the P-well region 10 are first formed. The region where the holes H_STI1 and H_STI2 are to be formed in the resist material 34 is removed by, for example, photolithography, and the mask material 33 is exposed. Thereafter, the holes H_STI1 and H_STI2 are formed by anisotropic etching using the pattern of the formed resist material 34. After the holes H_STI1 and H_STI2 are formed, the resist material 34 is removed.

The hole H_STI1 formed in this process penetrates the mask material 33, the conductor layer 24, and the gate insulating film 23 outside the N-well region 13 and reaches the P-well region 10. Further, the hole H_STI2 formed in this process penetrates the mask material 33, the conductor layer 24, and the gate insulating film 23 in the N-well region 13 and reaches the N-well region 13. The anisotropic etching in this process is, for example, a reactive ion etching (RIE).

Figure 6:
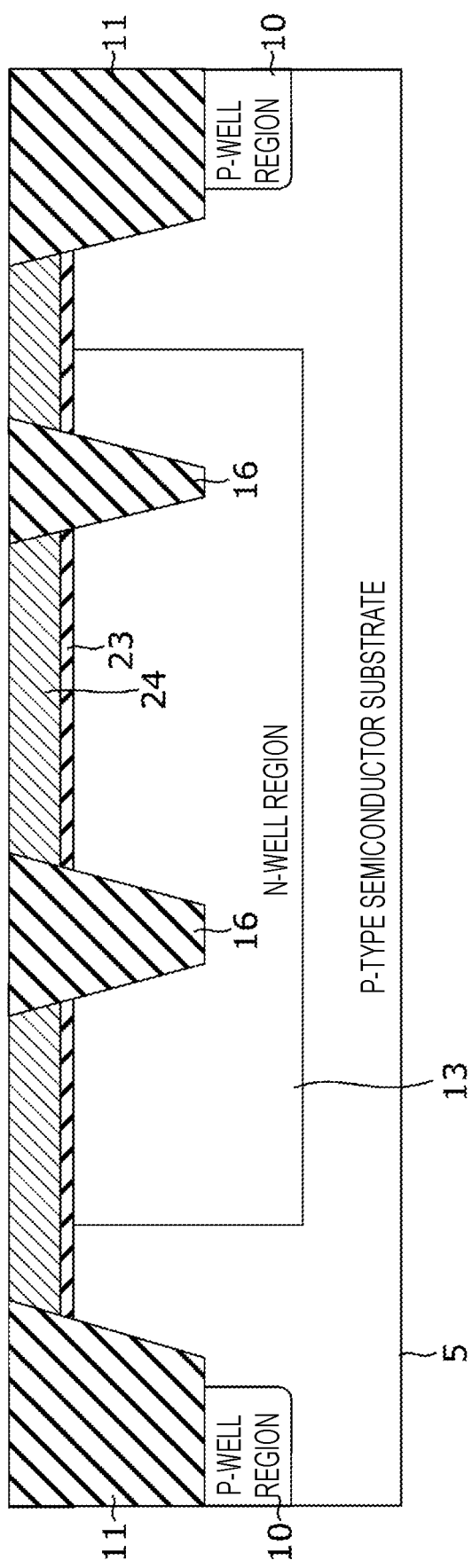
FIG. 6 is a cross-sectional view of a p-type transistor for illustrating a manufacturing process of the semiconductor device according to the first embodiment.

Next, as illustrated in FIG. 6, an insulator layer is embedded in the holes H_STI1 and H_STI2 to form insulator layers 11 and 16, respectively. Specifically, an insulator layer is formed over the entire surface to fill the holes H_STI1 and H_STI2. The surface of the stacked body after the insulator layer is formed is planarized using the mask material 33 as a stop film. Thereafter, the mask material 33 is removed, and the insulator layers 11 and 16 are further etched back. The planarization in this process is, for example, a chemical mechanical polishing (CMP).

Figure 7:
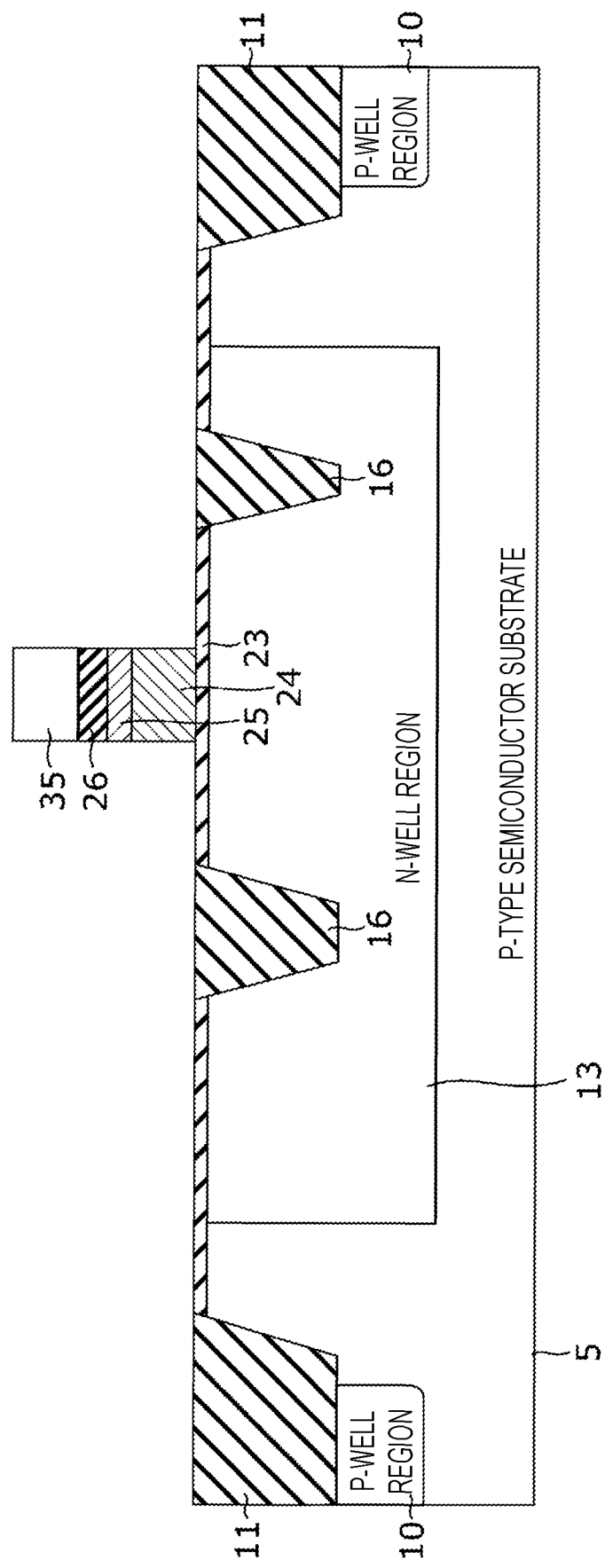
FIG. 7 is a cross-sectional view of a p-type transistor for illustrating a manufacturing process of the semiconductor device according to the first embodiment.

Next, as illustrated in FIG. 7, a stacked body (gate structure) that functions as the gate of the p-type transistor 2 is formed on a region where the channel region of the p-type transistor 2 is to be formed. Specifically, the conductor layer 24 is further formed on the upper surface of the structure after the insulator layers 11 and 16 are etched back, thereby increasing the thickness of the conductor layer 24. A conductor layer 25, an insulator layer 26, and a resist material 35 are sequentially stacked on the thickened conductor layer 24. A portion of the resist material 35 other than the region where the gate structure of the p-type transistor 2 is to be formed is removed by, for example, photolithography, and the insulating layer 26 in the region is exposed. Thereafter, the portions of the insulating layer 26, the conductor layer 25, and the conductor layer 24 in the pattern are removed by anisotropic etching using the pattern of the formed resist material 35, and a gate structure is formed by the remaining portions of the insulator layer 26, the conductor layer 25, and the conductor layer 24.

Figure 8:
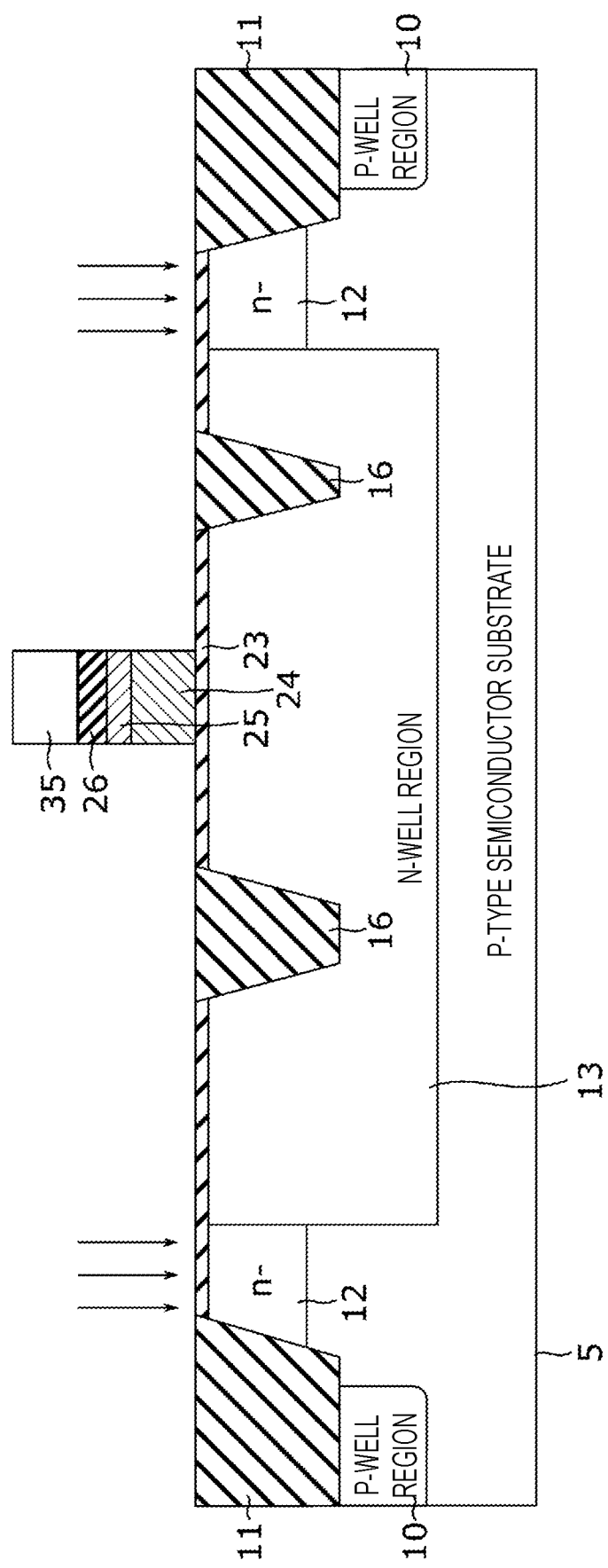
FIG. 8 is a cross-sectional view of a p-type transistor for illustrating a manufacturing process of the semiconductor device according to the first embodiment.

Next, as illustrated in FIG. 8, n-type impurities are selectively ion-implanted over the entire surface, and an n− impurity diffusion region 12 is formed in a region of the p-type semiconductor substrate 5 between the insulator layer 11 and the N-well region 13. As a result, the formation of a current leakage path that may occur among the N-well region 13, the P-well region 10, and the insulator layer 11 is prevented by the n− impurity diffusion region 12. After the n− impurity diffusion region 12 is formed, the resist material 35 is removed.

Further, in this process, n-type impurities may be implanted into a region other than the region where the n⁻ impurity diffusion region 12 is formed. However, the amount of the n-type impurities implanted in this process is negligibly small for the n-type impurities implanted when forming the n⁺ impurity diffusion region 14 and the p-type impurities implanted when forming the p⁺ impurity diffusion regions 17 and 19. For this reason, the n-type impurities implanted in this process do not substantially affect the region other than the region where the n⁻ impurity diffusion region 12 is formed.

Figure 9:
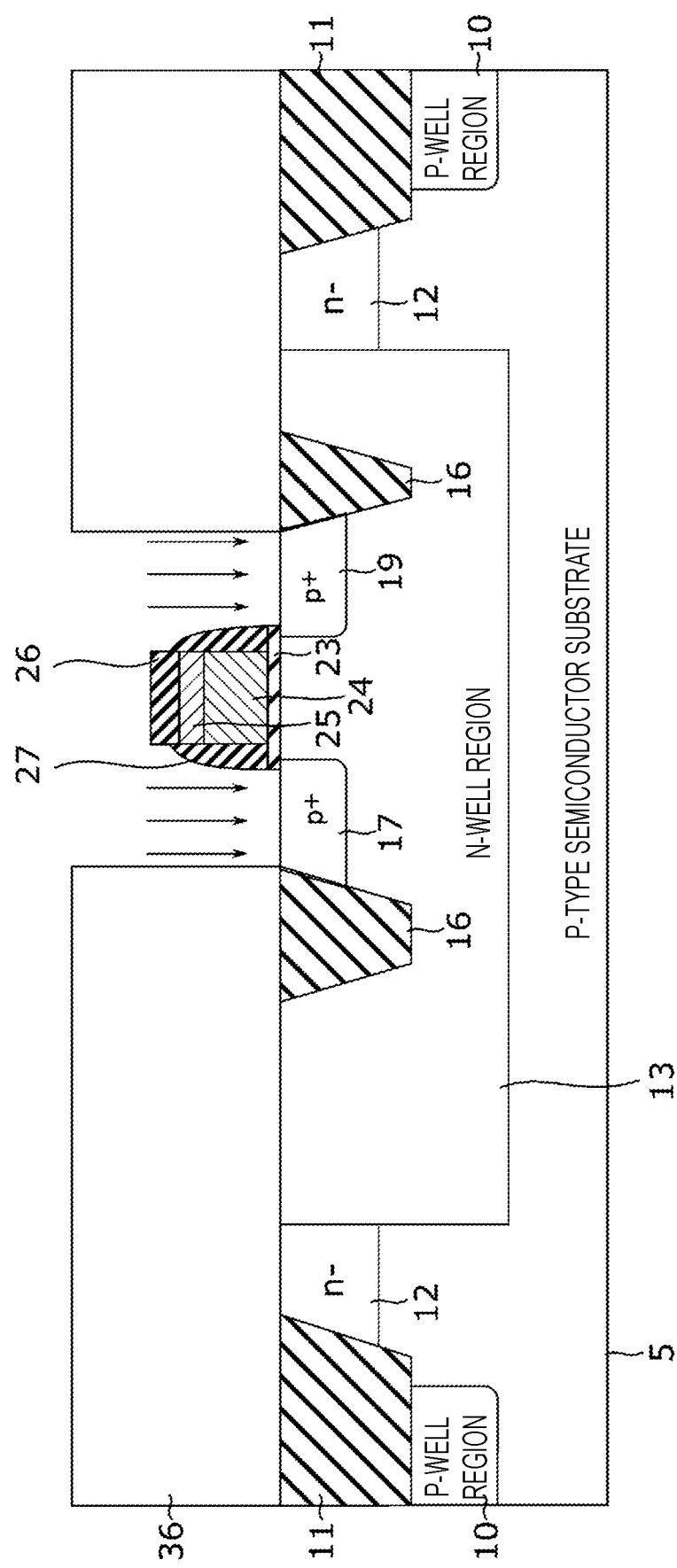
FIG. 9 is a cross-sectional view of a p-type transistor for illustrating a manufacturing process of the semiconductor device according to the first embodiment.

Next, as illustrated in FIG. 9, after the insulator layer 27 is formed on the side surface of the gate structure and the gate insulating film 23 is removed except for a portion corresponding to the channel region, the resist material 36 is formed over the entire surface. Of the resist material 36, the region where the p⁺ impurity diffusion regions 17 and 19 are to be formed and a portion formed on the region where the gate structure is formed are removed by, for example, photolithography and thus, the gate insulating film 23, and the insulator layers 26 and 27 are exposed. P-type impurities are selectively ion-implanted into the N-well region 13 below the exposed gate insulating film 23 to form the p⁺ impurity diffusion regions 17 and 19. In addition, the insulator layers 26 and 27 inhibit ion implantation into the gate structure. After the p⁺ impurity diffusion regions 17 and 19 are formed, the resist material 36 is removed.

Figure 10:
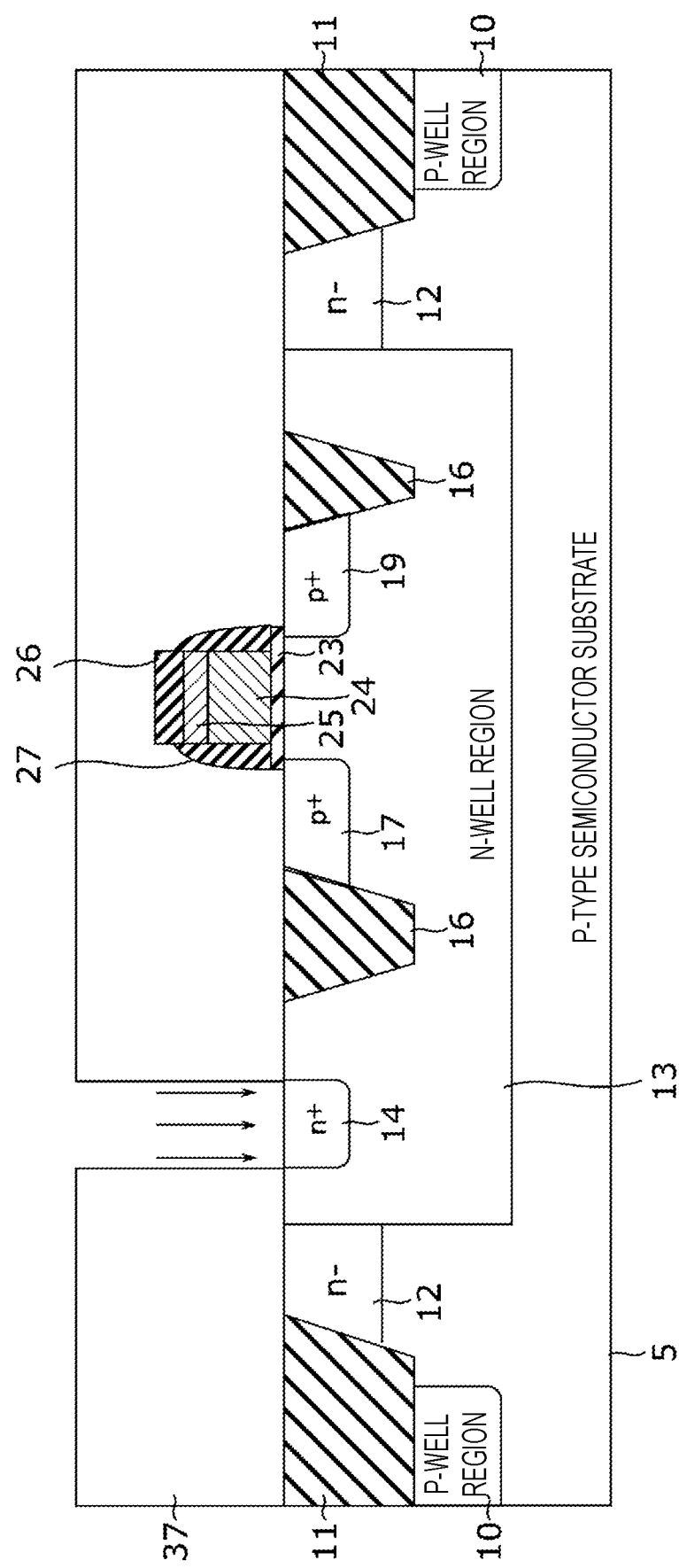
FIG. 10 is a cross-sectional view of a p-type transistor for illustrating a manufacturing process of the semiconductor device according to the first embodiment.

Next, as illustrated in FIG. 10, a resist material 37 is formed over the entire surface. A portion of the resist material 37 formed on a region where the n⁺ impurity diffusion region 14 is to be formed is removed by, for example, photolithography, and the N-well region 13 is exposed. Further, the region where the n⁺ impurity diffusion region 14 is to be formed is selectively set at, for example, a position away from the insulator layer 16.

N-type impurities are selectively ion-implanted into the exposed N-well region 13 to form the n⁺ impurity diffusion region 14. After the n⁺ impurity diffusion region 14 is formed, the resist material 37 is removed.

Figure 11:
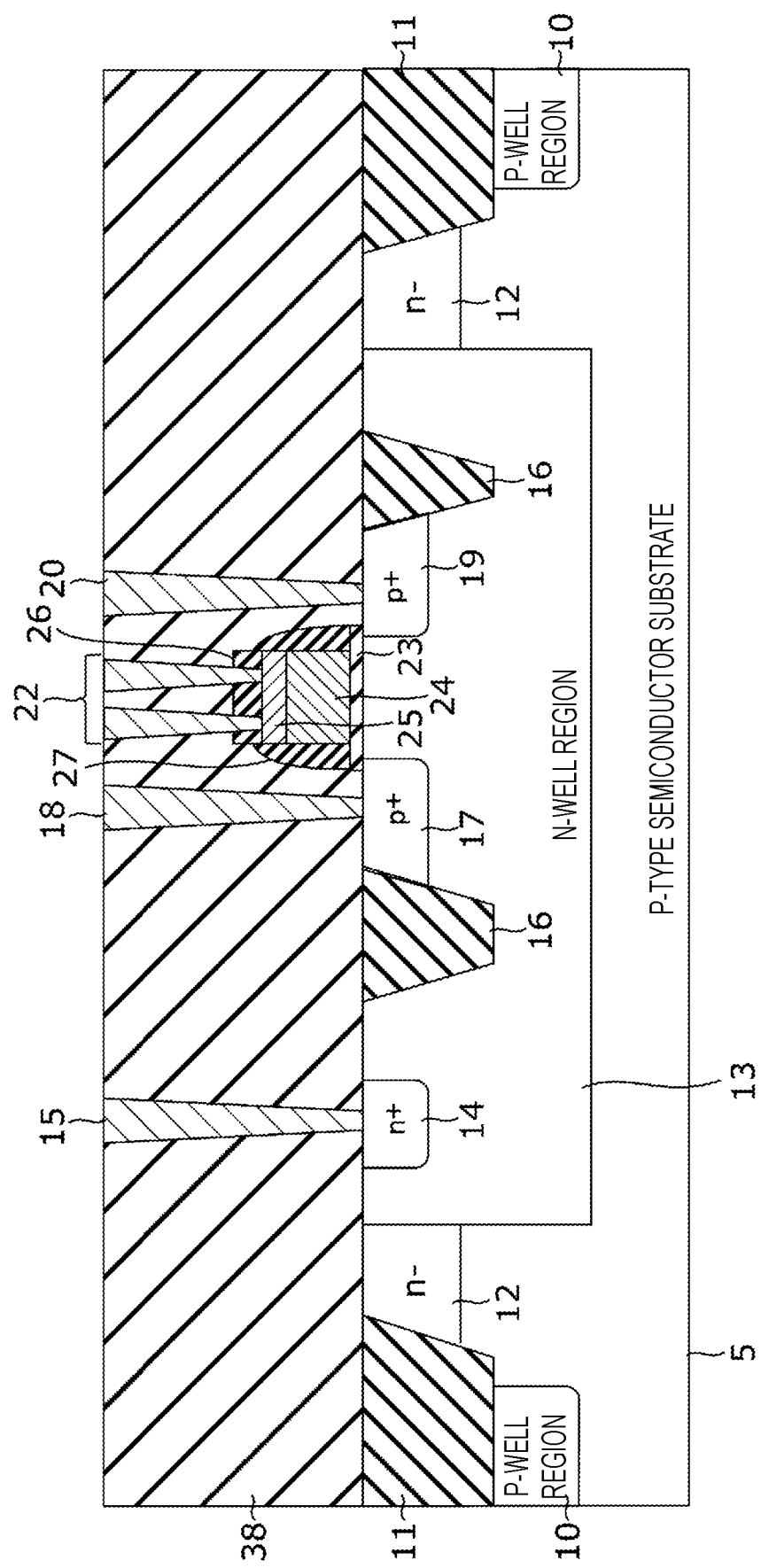
FIG. 11 is a cross-sectional view of a p-type transistor for illustrating a manufacturing process of the semiconductor device according to the first embodiment.

Next, as illustrated in FIG. 11, contacts 15, 18, 20, and 22 are formed on the upper surfaces of the n⁺ impurity diffusion region 14, the p⁺ impurity diffusion regions 17 and 19, and the conductor layer 25, respectively. Thereafter, an interlayer insulating film 38 is formed, and the manufacture of the p-type transistor 2 is completed.

1.3 Effect According to Present Embodiment

According to the first embodiment, a portion of the N-well region 13 that is aligned with the channel region along the length direction extends along the length direction without being sandwiched between element isolation regions such as the insulator layer 16. Therefore, it is possible to for the p-type transistor 2 according to the first embodiment to reduce an element area along the length direction by omitting the element isolation region and the portion sandwiched between the element isolation regions as compared with a case including the portion sandwiched between the element isolation regions along the length direction.

In some embodiments, when a p-type transistor and an n-type transistor are provided on a semiconductor substrate, an element isolation region is formed between the transistors in order to electrically isolate them. However, due to the manufacturing process of the n-type transistor, a path in which the p⁺ impurity diffusion region in the n-type transistor and the N-well region in the p-type transistor are electrically connected via the lower part of the element isolation region (leakage path) is formed, and the breakdown voltage characteristic of the N-well region of the p-type transistor may be deteriorated. In order to prevent the generation of such a path, the n⁻ impurity diffusion region may be formed between the N-well region and the element isolation region.

In addition, in the p-type transistor having a configuration surrounded by the n⁻ impurity diffusion region, a contact for controlling the potential of the n⁻ impurity diffusion region and a contact for controlling the potential of the back gate may be individually formed along the length direction in order to reliably control the potential of the n⁻ impurity diffusion region and the potential of the back gate, respectively. Further, the contact for controlling the potential of the back gate may be formed in a portion of the N-well region surrounded by the element isolation region.

According to the first embodiment, these two contacts are integrated into one contact 15, and the potentials of the back gate and the n⁻ impurity diffusion region 12 are controlled simultaneously via the n⁺ impurity diffusion region 14 provided with the contact 15 on the upper surface. Thus, the element isolation region surrounding the n⁺ impurity diffusion region 14 is not necessary, and the number of elements formed along the length direction may be reduced. Further, as described above, since the potential of the n⁻ impurity diffusion region 12 may also be controlled via the contact 15, the effect of preventing the formation of a leakage path among the P-well region 10, the insulator layer 11, and the N-well region 13 may be continuously maintained. Therefore, the element area may be reduced while preventing the deterioration of the well breakdown voltage characteristic of the transistor.

2. Second Embodiment

Next, a semiconductor device according to a second embodiment will be described. In the first embodiment, the n⁺ impurity diffusion region 14 is selectively formed in a region away from the insulator layer 16. This point is different from the second embodiment in that ion implantation for forming an n⁺ impurity diffusion region is performed for the region that may overlap with the insulator layer 16. In the following description, descriptions of the configuration and manufacturing method equivalent to those of the first embodiment will be omitted, and the configuration and manufacturing method different from those of the first embodiment will be mainly described.

2.1 Configuration

Figure 12:
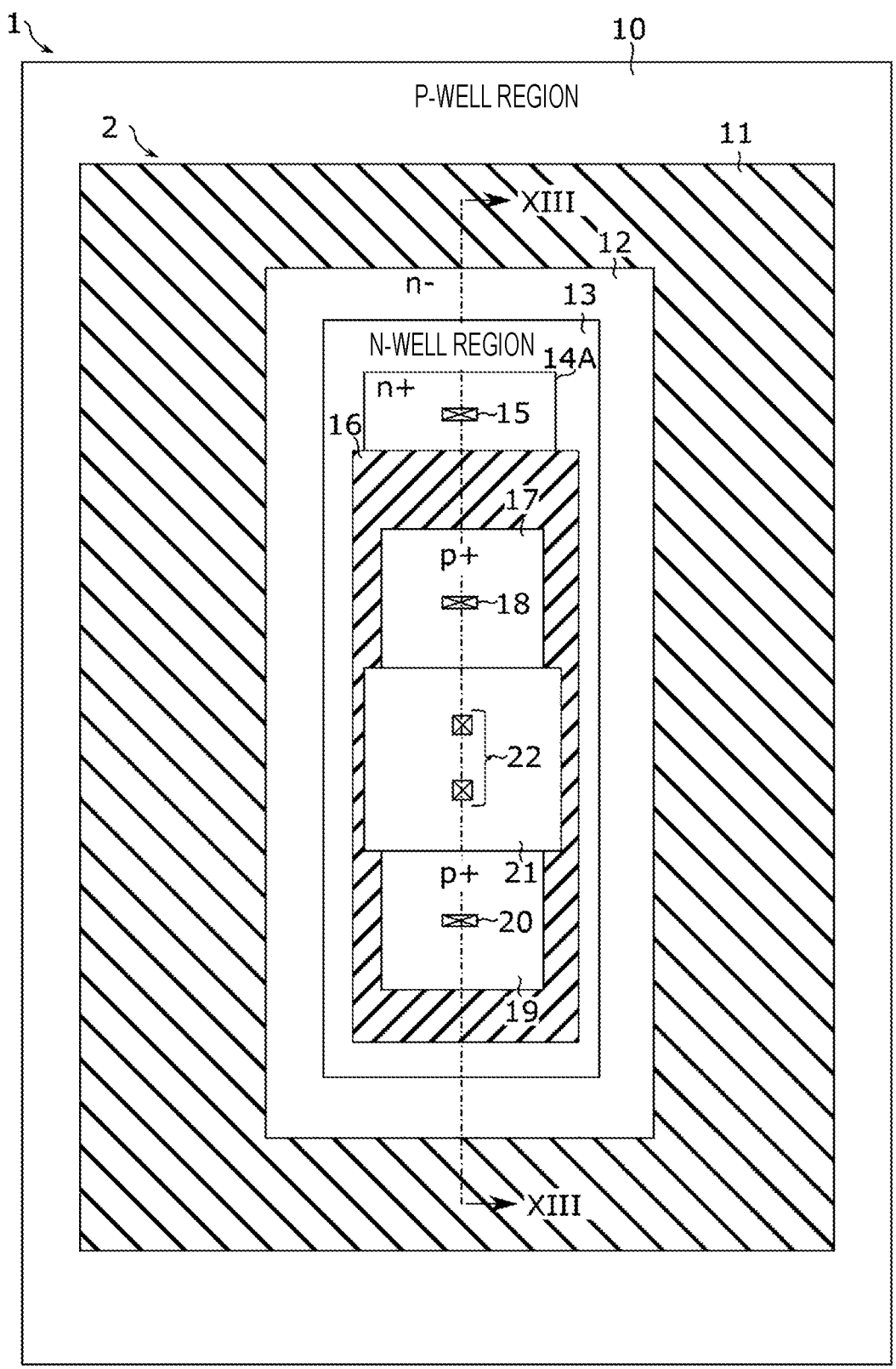
FIG. 12 is a plan view of a p-type transistor in a semiconductor device of a second embodiment as viewed from above.

FIG. 12 is a plan view of a p-type transistor in the semiconductor device according to the second embodiment as viewed from above, and corresponds to FIG. 1 of the first embodiment.

As illustrated in FIG. 12, an insulator layer 16 surrounding a part of the N-well region 13 is formed in the N-well region 13, and an n⁺ impurity diffusion region 14A is formed outside the insulator layer 16. The n⁺ impurity diffusion region 14A is in contact with the insulator layer 16.

A contact 15 is formed on the n⁺ impurity diffusion region 14A to control the potential of the N-well region 13. That is, the n⁺ impurity diffusion region 14A functions as a region that controls the potential of the back gate of the p-type transistor 2.

The p⁺ impurity diffusion region 19, the conductor layer 21 (or the channel region), the p⁺ impurity diffusion region 17, and the n⁺ impurity diffusion region 14A are formed, for example, in a straight line along the length direction of the p-type transistor 2 in this order.

Figure 13:
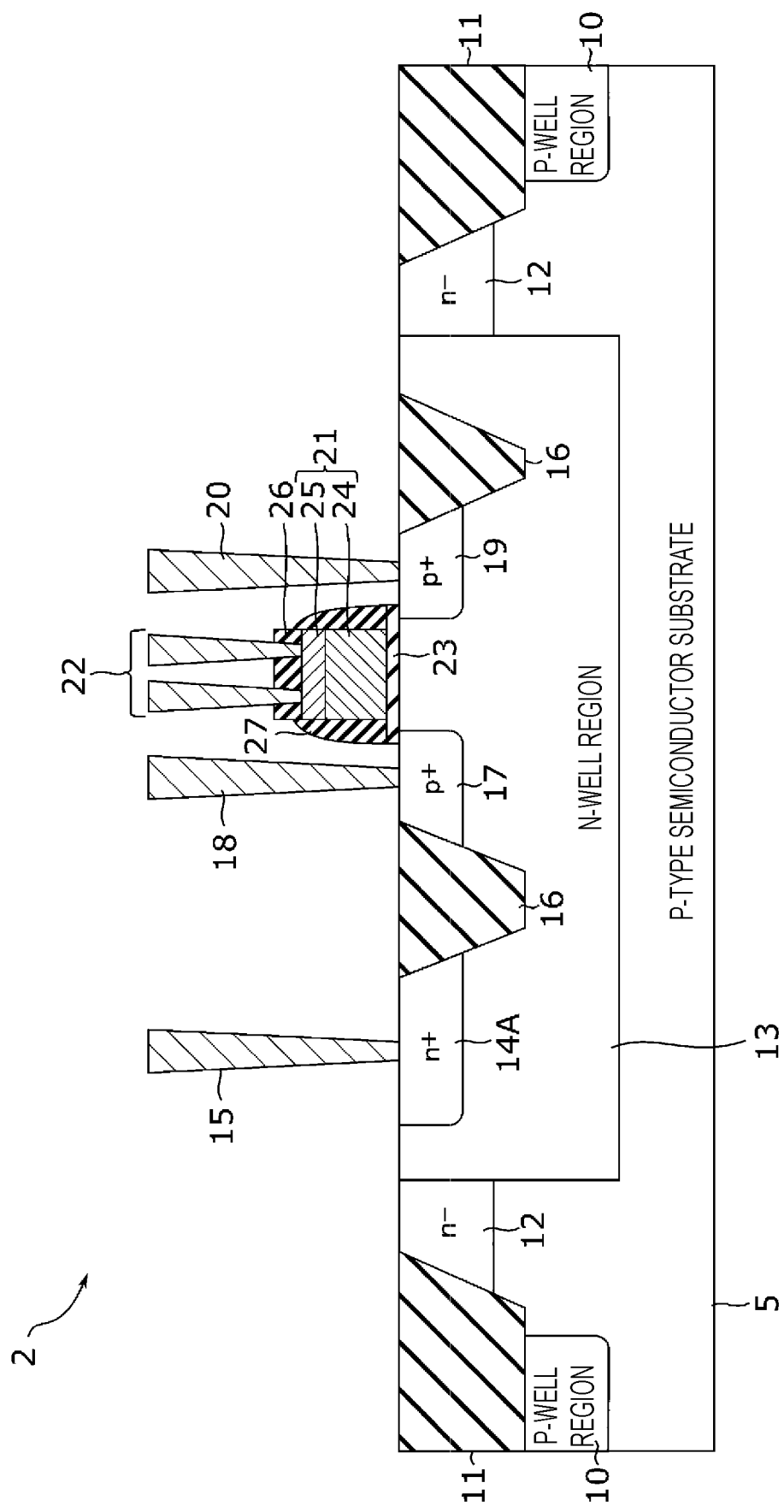
FIG. 13 is a cross-sectional view of a p-type transistor taken along line XIII-XIII in FIG. 12.

FIG. 13 is a cross-sectional view of the p-type transistor 2 taken along a straight line (line XIII-XIII in FIG. 12) extending in the length direction of the p-type transistor 2 described above.

As illustrated in FIG. 13, the n$^+$ impurity diffusion region 14A is formed up to a position shallower than the lower end of the insulator layer 16, and includes a portion formed below a portion of the insulator layer 16 which is formed on the surface of the p-type semiconductor substrate 5.

2.2 Manufacturing Method

Figure 14:
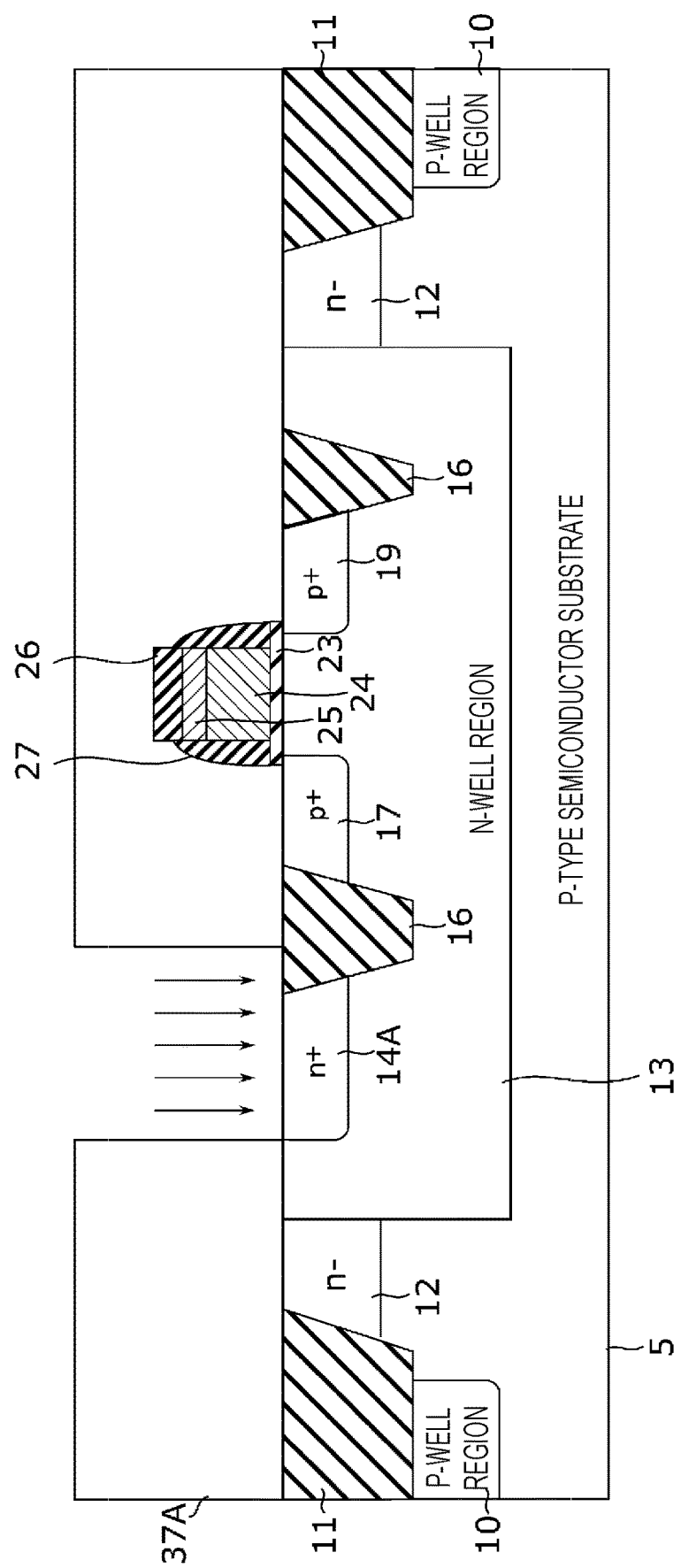
FIG. 14 is a cross-sectional view of a p-type transistor for illustrating a manufacturing process of the semiconductor device according to the second embodiment.

An example of a manufacturing process of the p-type transistor 2 in the semiconductor device according to the second embodiment will be described with reference to FIG. 14. FIG. 14 illustrates an example of a cross-sectional structure including a structure corresponding to the p-type transistor 2 in the manufacturing process of the semiconductor device according to the second embodiment, and corresponds to FIG. 10 in the first embodiment.

First, the N-well region 13, the P-well region 10, the insulator layers 11 and 16, the gate structure of the p-type transistor 2, the n$^-$ impurity diffusion region 12, and the p$^+$ impurity diffusion regions 17 and 19 are formed in the p-type semiconductor substrate 5 by a process similar to those illustrated in FIGS. 3 to 9 in the first embodiment.

Next, as illustrated in FIG. 14, a resist material 37A is formed over the entire surface. A portion of the resist material 37A formed on a region including a region where the n$^+$ impurity diffusion region 14A is to be formed is removed by, for example, photolithography. Further, a portion of a region including a region where the n$^+$ impurity diffusion region 14A is to be formed may overlap with, for example, the insulator layer 16. For this reason, since the resist material 37A is removed by photolithography, the N-well region 13 and a part of the insulator layer 16 may be exposed.

N-type impurities are selectively ion-implanted into the exposed N-well region 13 to form the n$^+$ impurity diffusion region 14A. At this time, ions are also implanted into a part of the exposed insulator layer 16, but the n-type impurities implanted into the insulator layer 16 are not activated and may be ignored. After the n$^+$ impurity diffusion region 14A is formed, the resist material 37A is removed.

Next, the contacts 15, 18, 20, and 22 are formed on the upper surfaces of the n$^+$ impurity diffusion region 14A, the p$^+$ impurity diffusion regions 17 and 19, and the conductor layer 25, respectively, by a process similar to that illustrated in FIG. 11 in the first embodiment. Thereafter, an interlayer insulating film 38 is formed, and the manufacture of the p-type transistor 2 is completed.

2.3 Effect According to Present Embodiment

According to the second embodiment, a region including a part of the insulator layer 16 is exposed by photolithography in addition to the N-well region 13 where the n$^+$ impurity diffusion region 14A is to be formed. As a result, it is possible to prevent the N-well region 13 from being exposed more than necessary by photolithography while keeping the minimum area of the n$^+$ impurity diffusion region 14A. Therefore, the area of the n$^+$ impurity diffusion region 14A may be reduced to a minimum size, and an increase in the distance from the p$^+$ impurity diffusion region 17 to the n$^-$ impurity diffusion region 12 via the n$^+$ impurity diffusion region 14A may be prevented. That is, an increase in the element area of the p-type transistor 2 along the length direction may be prevented.

3. Third Embodiment

Next, a semiconductor device according to a third embodiment will be described. In the first embodiment, descriptions have been made on a case where the n$^+$ impurity diffusion region 14 and the p$^+$ impurity diffusion region 17 are separated from each other by forming the insulator layer therebetween. In contrast, in the third embodiment, descriptions will be made on a case where the n$^+$ impurity diffusion region and one of the two p$^+$ impurity diffusion regions are not separated from each other by the element isolation region. In the following description, descriptions of the configuration and manufacturing method equivalent to those of the first embodiment will be omitted, and the configuration and manufacturing method different from those of the first embodiment will be mainly described.

3.1 Configuration

Figure 15:
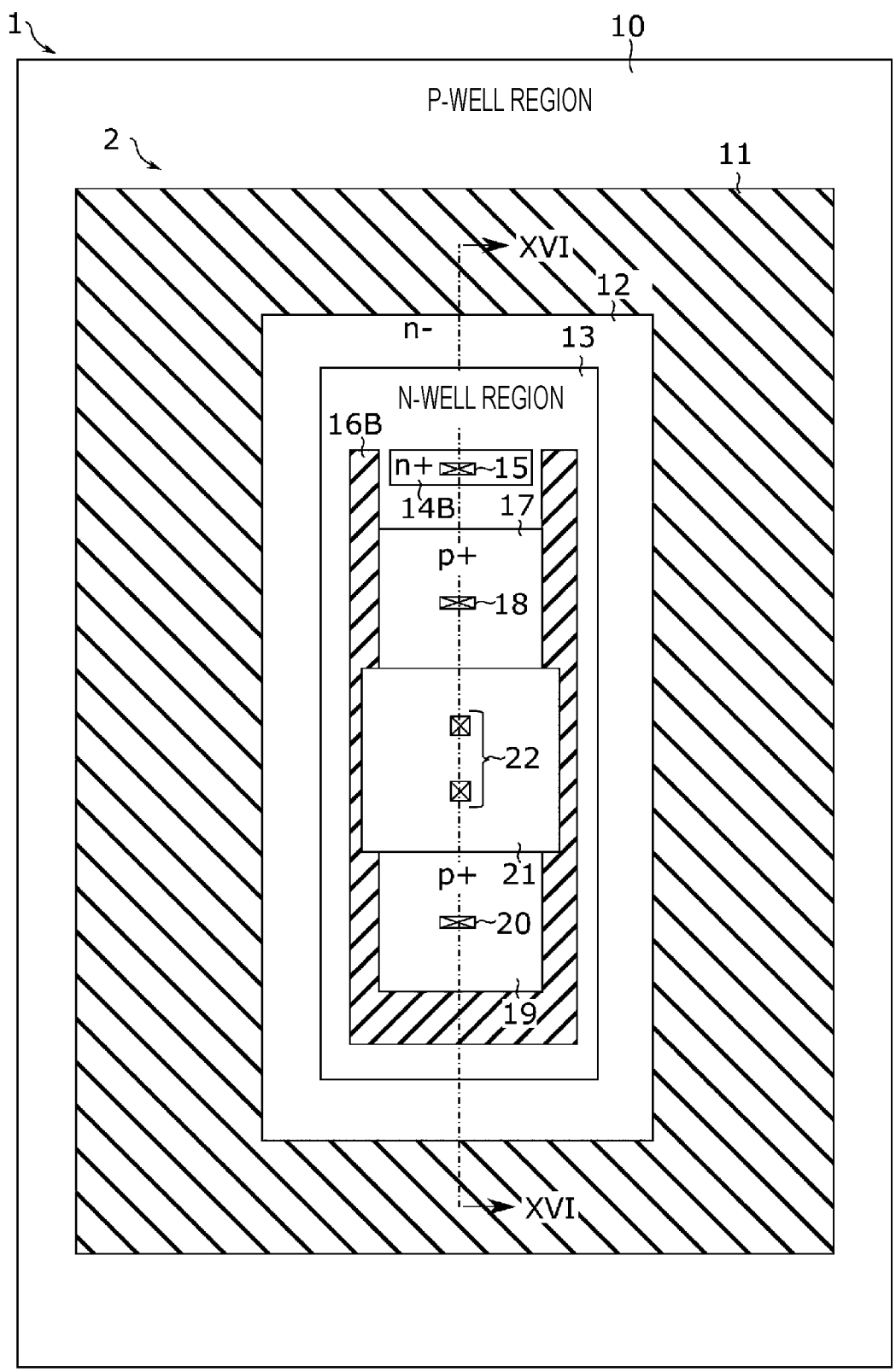
FIG. 15 is a plan view of a p-type transistor in a semiconductor device according to a third embodiment as viewed from above.

FIG. 15 is a plan view of a p-type transistor in the semiconductor device according to the third embodiment as viewed from above, and corresponds to FIG. 1 in the first embodiment.

As illustrated in FIG. 15, a U-shaped insulator layer 16B is formed in the N-well region 13. Two opposing sides of the U-shaped insulator layer 16B extend along the length direction of the p-type transistor 2. An n$^+$ impurity diffusion region 14B is formed in an opening of the insulator layer 16B (i.e., a region connecting both ends of the insulator layer 16B). A contact 15 is formed on the n$^+$ impurity diffusion region 14B to control the potential of the N-well region 13. That is, the n$^+$ impurity diffusion region 14B functions as a region that controls the potential of the back gate of the p-type transistor 2.

In the N-well region 13 sandwiched between two opposing sides of the U-shaped insulator layer 16B, the p$^+$ impurity diffusion regions 17 and 19 are formed apart from each other. That is, the p$^+$ impurity diffusion region 19 is separated from the p$^+$ impurity diffusion region 17 and the n$^+$ impurity diffusion region 14 by the channel region and the insulator layer 16B. Meanwhile, the p$^+$ impurity diffusion region 17 is electrically connected to the n$^+$ impurity diffusion region 14B through the N-well region 13 (not through the insulator layer 16B).

The p$^+$ impurity diffusion regions 17 and 19 function as the source and drain of the p-type transistor 2, respectively. Further, as described above, the n$^+$ impurity diffusion region 14B and the p$^+$ impurity diffusion region have the same potential because there is no element isolation region between the regions. For this reason, the p-type transistor 2 according to the third embodiment has a configuration that is applicable when the source and the back gate may be set to the same potential.

The p$^+$ impurity diffusion region 19, the conductor layer 21 (or the channel region), the p$^+$ impurity diffusion region 17, and the n$^+$ impurity diffusion region 14B are formed, for example, in a straight line along the length direction of the p-type transistor 2 in this order.

Figure 16:
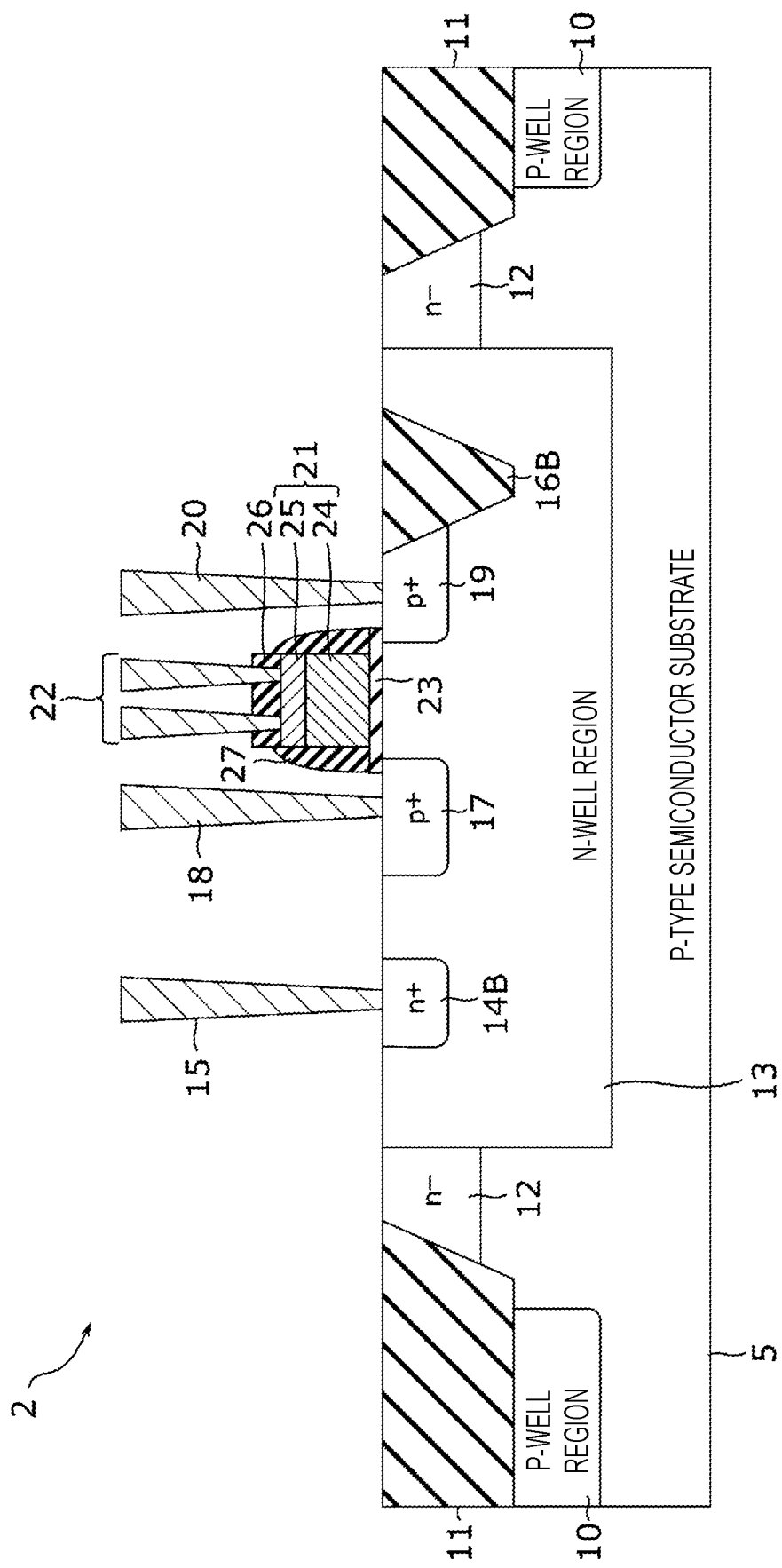
FIG. 16 is a cross-sectional view of a p-type transistor taken along line XVI-XVI in FIG. 15.

FIG. 16 is a cross-sectional view of the p-type transistor 2 along a straight line (line XVI-XVI in FIG. 15) extending in the length direction of the p-type transistor 2 described above.

As illustrated in FIG. 16, the lower end of the insulator layer 16B is formed at a position shallower than the lower end of the N-well region 13, and the p$^+$ impurity diffusion regions 17B and 19 are formed up to a position shallower than the lower end of the insulator layer 16B. Further, the insulator layers 11 and 16B are formed to, for example, an equivalent depth.

3.2 Manufacturing Method

An example of a manufacturing process of the p-type transistor 2 in the semiconductor device according to the third embodiment will be described with reference to FIGS.

Figure 17:
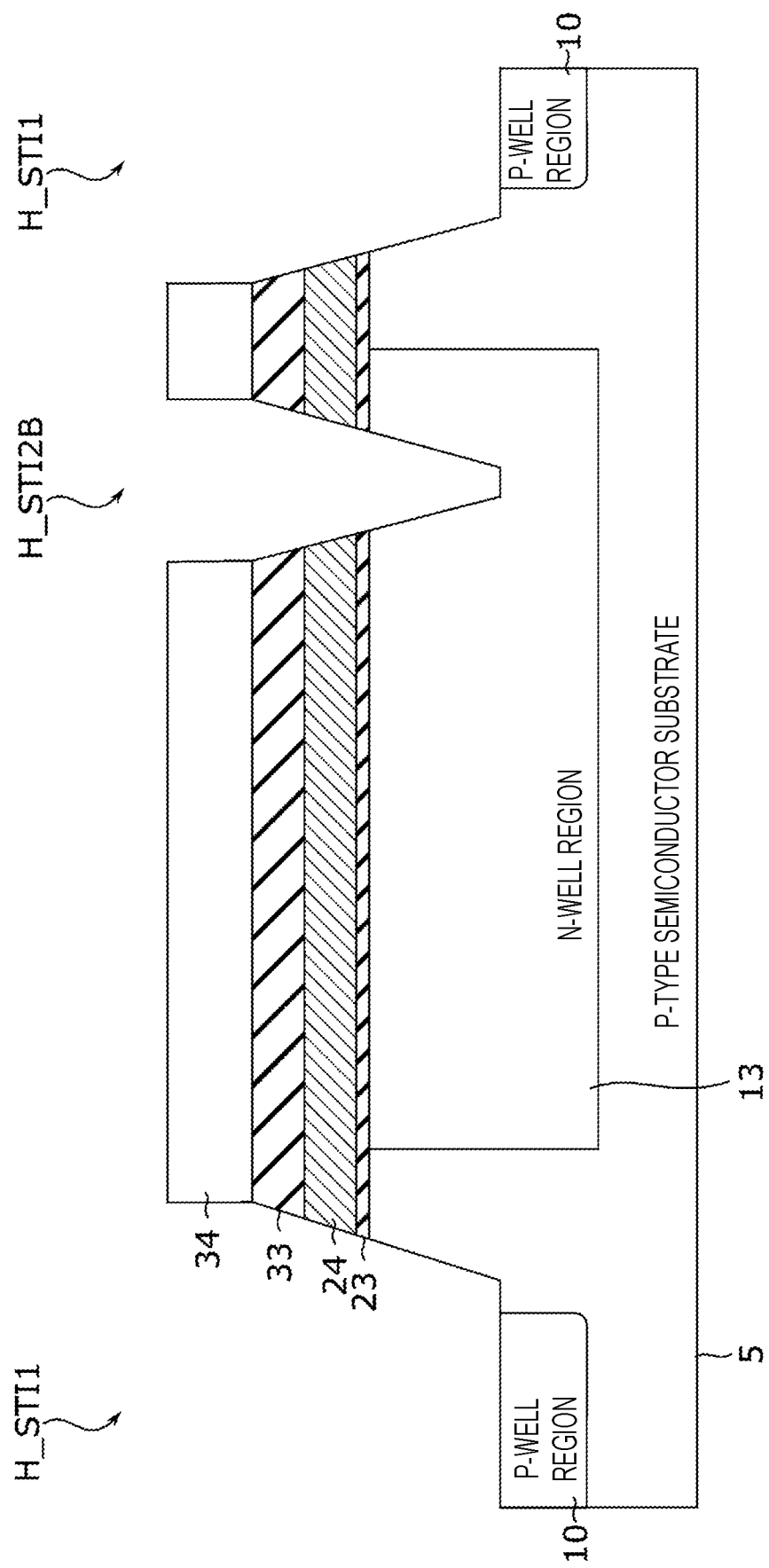
FIG. 17 is a cross-sectional view of a p-type transistor for illustrating a manufacturing process of the semiconductor device according to the third embodiment.
Figure 18:
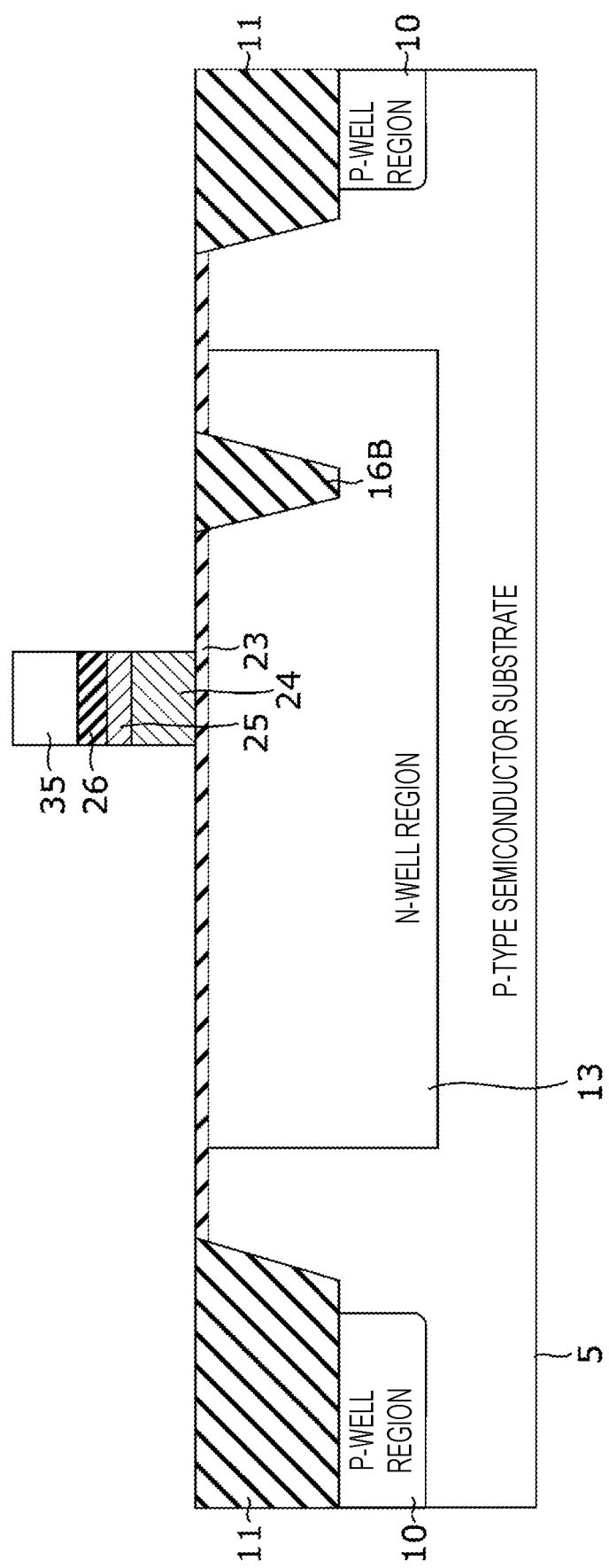
FIG. 18 is a cross-sectional view of a p-type transistor for illustrating a manufacturing process of the semiconductor device according to the third embodiment.
Figure 19:
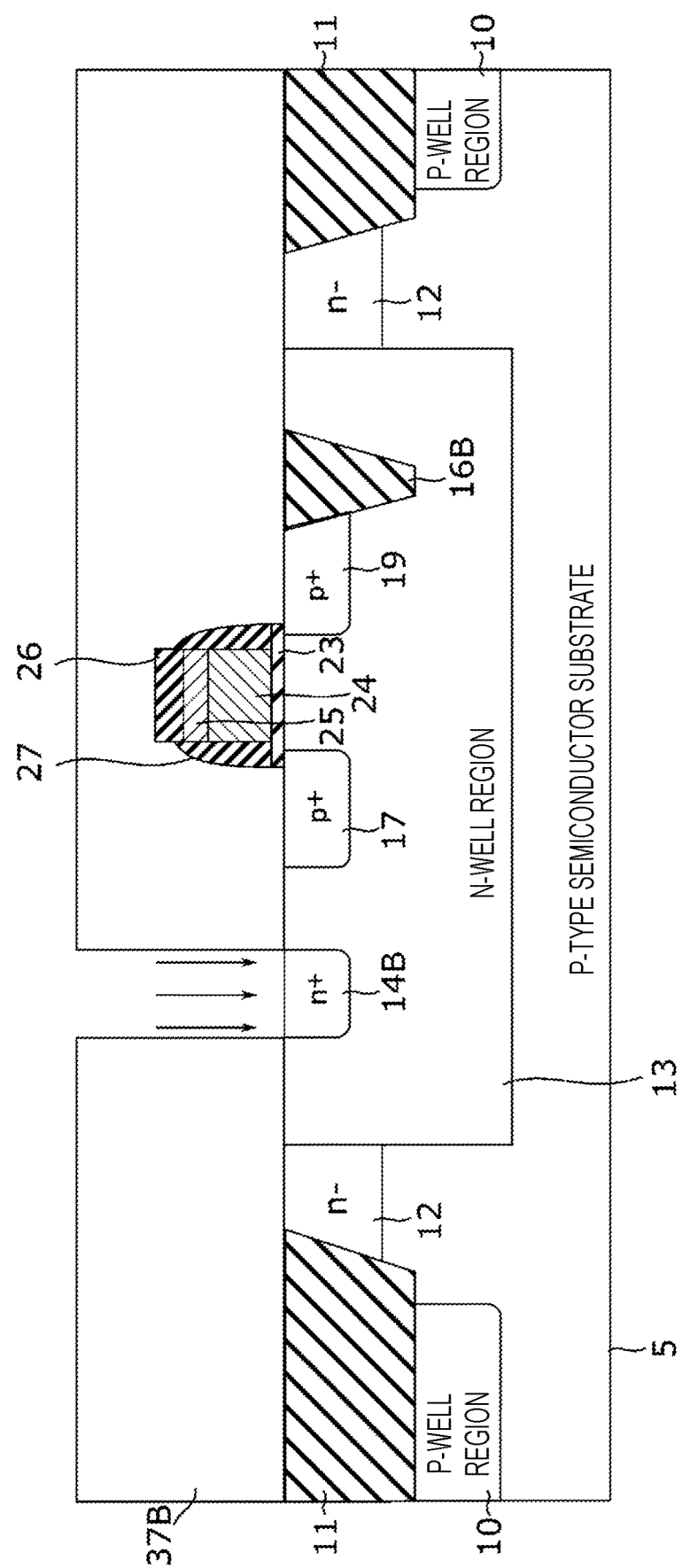
FIG. 19 is a cross-sectional view of a p-type transistor for illustrating a manufacturing process of the semiconductor device according to the third embodiment.

17 to 19. FIGS. 17 to 19 illustrate an example of a cross-sectional structure including a structure corresponding to the p-type transistor 2 in the manufacturing process of the semiconductor device according to the third embodiment, and correspond to FIGS. 5, 7, and 10 in the first embodiment, respectively.

First, the N-well region 13 and the P-well region 10 are formed in the p-type semiconductor substrate 5 by a process similar to the processes illustrated in FIGS. 3 and 4 in the first embodiment.

Next, as illustrated in FIG. 17, holes H_STI1 and H_STI2B are formed in regions where the insulator layers 11 and 16B are to be formed, respectively. Specifically, the gate insulating film 23, the conductor layer 24, the mask material 33, and the resist material 34 are sequentially stacked on the p-type semiconductor substrate 5 after the N-well region 13 and the P-well region 10 are first formed. A region of the resist material 34 where the holes H_STI1 and H_STI2B are to be formed is removed by, for example, photolithography, and the mask material 33 is exposed. Thereafter, the holes H_STI1 and H_STI2B are formed by anisotropic etching using the pattern of the formed resist material 34. After the holes H_STI1 and H_STI2B are formed, the resist material 34 is removed. The hole H_STI2B formed in this process penetrates the mask material 33, the conductor layer 24, and the gate insulating film 23 in the N-well region 13 and reaches the N-well region 13.

Next, as illustrated in FIG. 18, after the insulator layers 11 and 16B are formed by a process similar to the process illustrated in FIG. 6 in the first embodiment, a stacked body that functions as the gate of the p-type transistor 2 is formed on a region where the channel region of the p-type transistor 2 is to be formed. Specifically, after an insulator layer is formed over the entire surface to fill the holes H_STI1 and H_STI2B, the mask material 33 is removed after the surface is planarized, and the insulator layers 11 and 16B are further etched back. Since the process of forming the gate structure of the p-type transistor 2 on the upper surface of the structure after the insulator layers 11 and 16B are etched back is the same as that of the first embodiment, the description thereof is omitted.

Next, the $n^-$ impurity diffusion region 12 and the $p^+$ impurity diffusion regions 17 and 19 are formed by a process similar to the processes illustrated in FIGS. 8 and 9 in the first embodiment.

Next, as illustrated in FIG. 19, a resist material 37B is formed over the entire surface. A portion of the resist material 37B formed on the region where the $n^+$ impurity diffusion region 14B is to be formed is removed by, for example, photolithography, and the corresponding portion of the N-well region 13 is exposed. Further, the region where the $n^+$ impurity diffusion region 14B is to be formed is set between the $n^-$ impurity diffusion region 12 and the $p^+$ impurity diffusion region 17 so as to be separated from the regions.

N-type impurities are selectively ion-implanted into the exposed N-well region 13 to form the $n^+$ impurity diffusion region 14B. After the $n^+$ impurity diffusion region 14B is formed, the resist material 37B is removed.

Next, the contacts 15, 18, 20, and 22 are formed on the upper surfaces of the $n^+$ impurity diffusion region 14B, the $p^+$ impurity diffusion regions 17 and 19, and the conductor layer 25, respectively, by a process similar to the process illustrated in FIG. 11 in the first embodiment. Thereafter, the interlayer insulating film 38 is formed, and the manufacture of the p-type transistor 2 is completed.

3.3 Effect According to Present Embodiment

According to a third embodiment, the $n^+$ impurity diffusion region 14B is formed between the $p^+$ impurity diffusion region 17 without intervening an element isolation region. Thus, a distance between the $n^+$ impurity diffusion region 14B and the $p^+$ impurity diffusion region 17 may be shortened as compared with a case where an element isolation region is formed between the $n^+$ impurity diffusion region 14B and the $p^+$ impurity diffusion region 17. For this reason, the length direction of the p-type transistor 2 may be shortened, and as a result, the element area of the p-type transistor 2 may be reduced.

Further, the insulator layer 16B does not surround a part of the N-well region 13, has a U shape with one side of the rectangle opened, and does not electrically cut between the $n^+$ impurity diffusion region 14B and the $p^+$ impurity diffusion region 17. For this reason, the p-type transistor 2 according to the third embodiment is applicable when the source and the back gate may be set to the same potential.

4. Fourth Embodiment

Next, a semiconductor device according to a fourth embodiment will be described. In the third embodiment, descriptions have been made on a case where the drain of the p-type transistor 2 is separated from the source by the channel region and the element isolation region. In the fourth embodiment, descriptions will be made on a case where the drain of the p-type transistor 2 is separated from the source only by the channel region. In the following description, descriptions of configurations and manufacturing methods equivalent to those of the first embodiment or the third embodiment will be omitted, and configurations and manufacturing methods different from the first embodiment or the third embodiment will be mainly described.

4.1 Configuration

Figure 20:
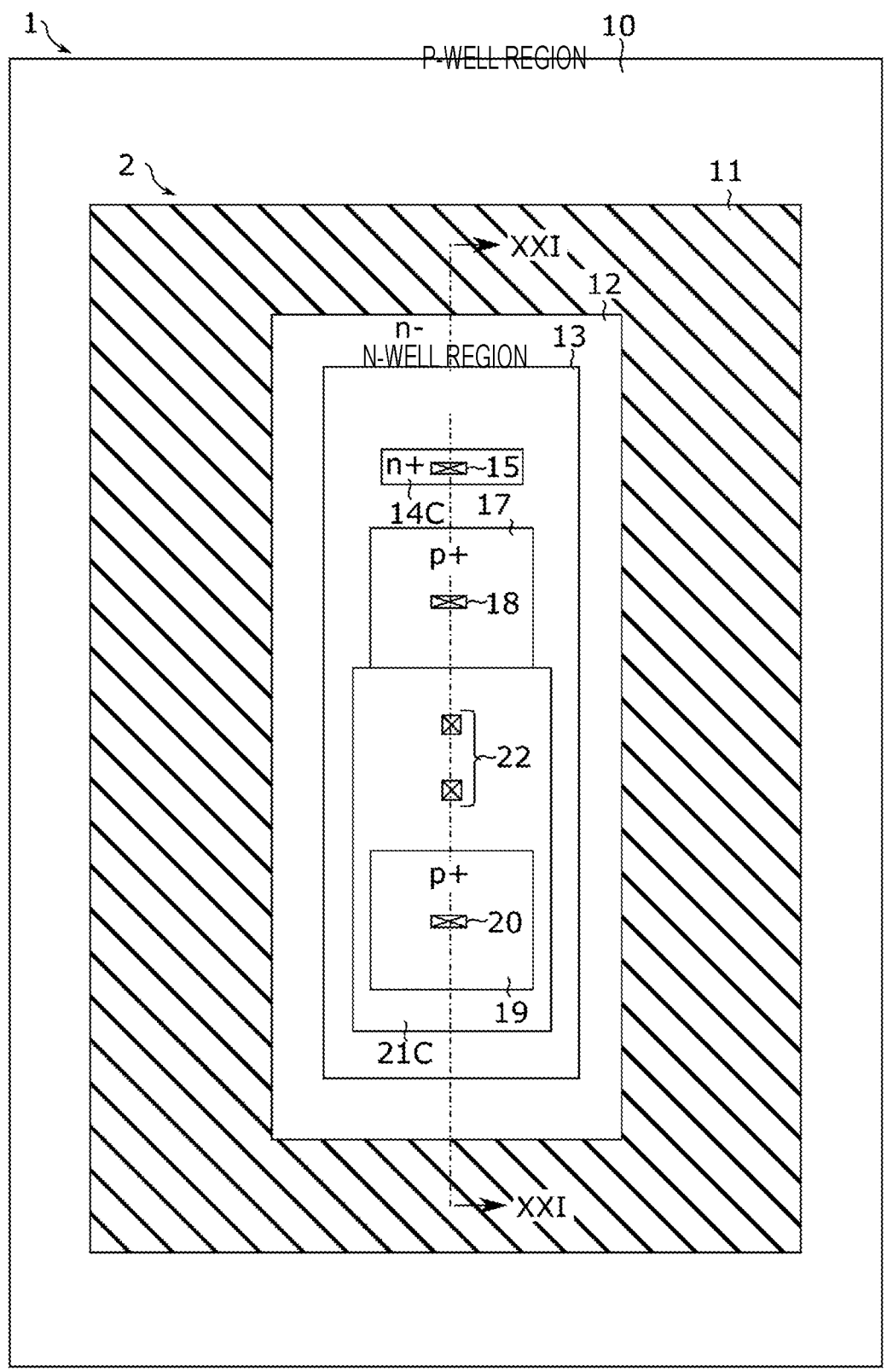
FIG. 20 is a top plan view of a p-type transistor in a semiconductor device according to a fourth embodiment.

FIG. 20 is a plan view of a p-type transistor in the semiconductor device according to the fourth embodiment as viewed from above, and corresponds to FIG. 15 in the third embodiment.

As illustrated in FIG. 20, the $p^+$ impurity diffusion regions 19 and 17 and an $n^+$ impurity diffusion region 14C are formed in the N-well region 13 in this order along the length direction to be spaced apart from each other. Further, an element isolation region is not formed in the N-well region 13. For this reason, in the p-type transistor 2 of the fourth embodiment, the source and the back gate have the same potential as in the third embodiment.

A conductor layer 21C is formed above a region which surrounds the $p^+$ impurity diffusion region 19 including a region between the $p^+$ impurity diffusion regions 17 and 19 via a gate insulating film (not illustrated). The conductor layer 21C functions as the gate of the p-type transistor 2. For this reason, in the N-well region 13, a region surrounding the $p^+$ impurity diffusion region 19 (region in which the conductor layer 21C is formed above) functions as a channel region of the p-type transistor 2. That is, the $p^+$ impurity diffusion region 19 is separated from the $p^+$ impurity diffusion region 17 and the $n^+$ impurity diffusion region 14C only by the channel region.

Figure 21:
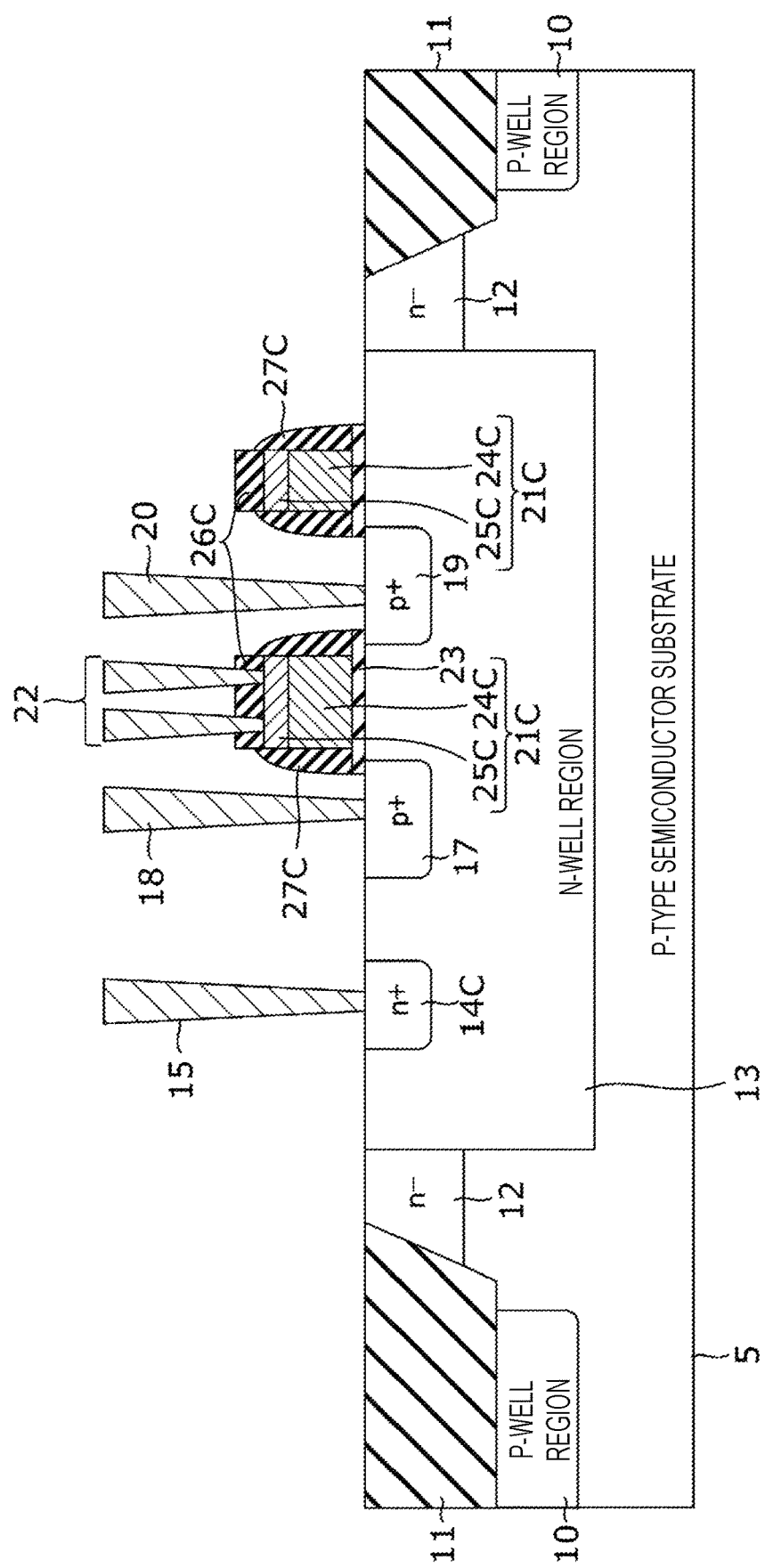
FIG. 21 is a cross-sectional view of a p-type transistor taken along line XXI-XXI in FIG. 20.

FIG. 21 is a cross-sectional view of the p-type transistor 2 along a straight line (line XXI-XXI in FIG. 20) extending in the length direction of the p-type transistor 2 described above.

As illustrated in FIG. 21, the conductor layer 21C including conductor layers 24C and 25C is formed on the top surface of the gate insulating film 23. The conductor layer 24C is formed on the top surface of the gate insulating film 23, and the conductor layer 25C is formed on the top surface of the conductor layer 24C.

Insulator layers 26C and 27C are formed on the top and side surfaces of the conductor layer 21C, respectively. As described above, a gate structure including the conductor layer 21C and the insulator layer 26C is formed in a ring shape to surround the p$^+$ impurity diffusion region 19. Therefore, an insulator layer 27C is formed anywhere on the inner peripheral surface (i.e., the p$^+$ impurity diffusion region 19 side) and the outer peripheral surface (i.e., the p$^+$ impurity diffusion region 17 side) of the ring-shaped gate structure.

4.2 Manufacturing Method

An example of a manufacturing process of the p-type transistor 2 in the semiconductor device according to the fourth embodiment will be described with reference to FIGS. 22 to 25. FIGS. 22 to 25 illustrate an example of a cross-sectional structure including a structure corresponding to the p-type transistor 2 in the manufacturing process of the semiconductor device according to the fourth embodiment, and correspond to FIGS. 5, 7, 9, and 10 in the first embodiment, respectively.

First, the N-well region 13 and the P-well region 10 are formed in the p-type semiconductor substrate 5 by a process similar to the processes illustrated in FIGS. 3 and 4 in the first embodiment.

Figure 22:
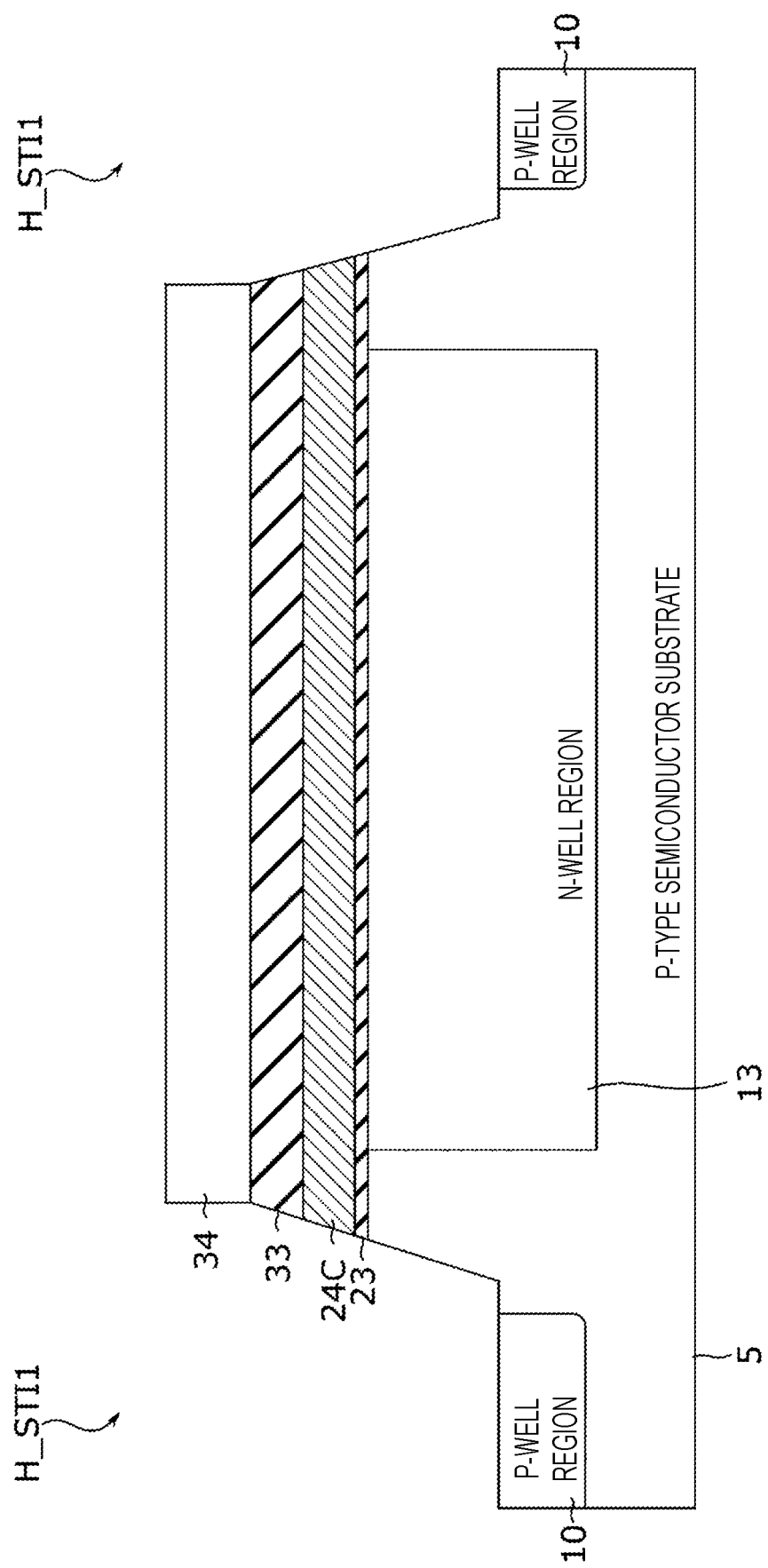
FIG. 22 is a cross-sectional view of a p-type transistor for illustrating a manufacturing process of the semiconductor device according to the fourth embodiment.

Next, as illustrated in FIG. 22, a hole H_STI1 is formed in the region where the insulator layer 11 is to be formed. The hole forming process is the same as that of the first embodiment except that a hole H_STI2 is not formed, and thus the description thereof is omitted.

Figure 23:
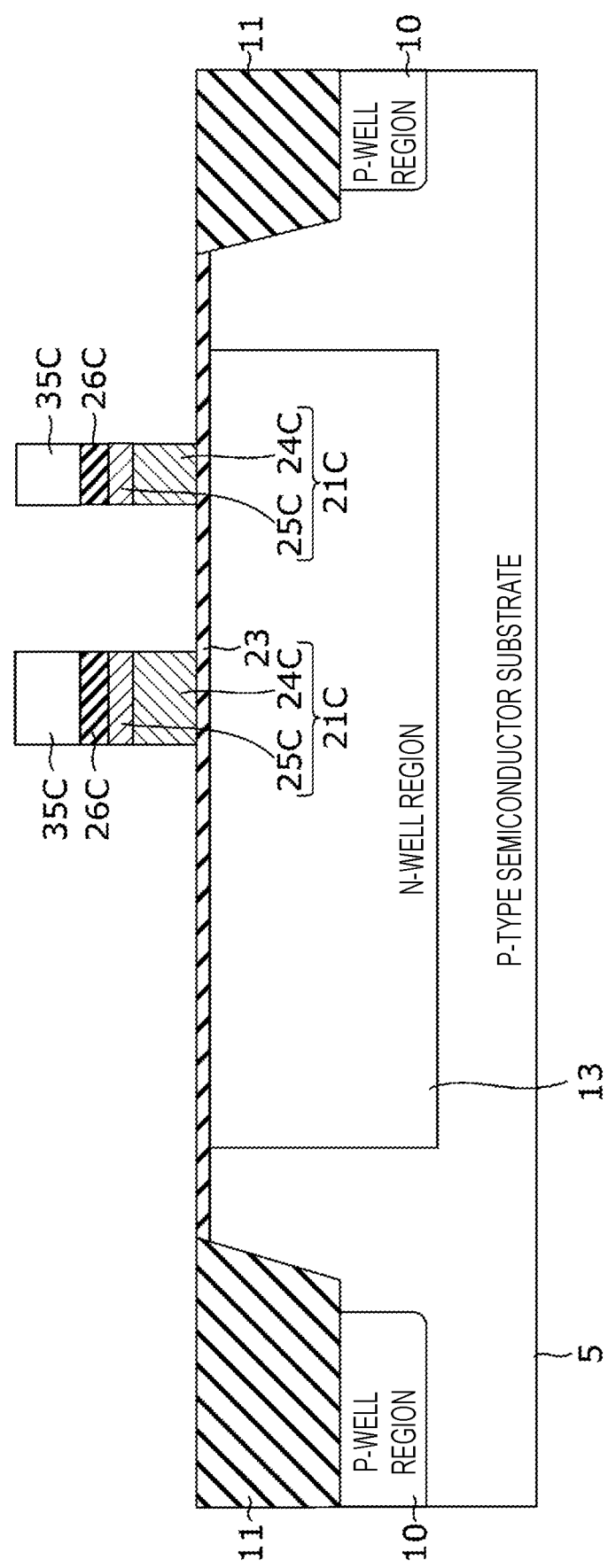
FIG. 23 is a cross-sectional view of a p-type transistor for illustrating a manufacturing process of the semiconductor device according to the fourth embodiment.

Next, as illustrated in FIG. 23, a stacked body (gate structure) that functions as the gate of the p-type transistor 2 on a region where the channel region of the p-type transistor 2 is to be formed after the insulator layer 11 is formed by a process similar to the process illustrated in FIG. 6 in the first embodiment. Specifically, after an insulator layer is formed over the entire surface to fill the hole H_STI1, the mask material 33 is removed after the surface is planarized, and the insulator layer 11 is further etched back. A conductor layer 24C is further formed on the top surface of the structure after the insulator layer 11 is etched back, thereby thickening the conductor layer 24C. The conductor layer 25C, the insulator layer 26C, and a resist material 35C are sequentially stacked on the thickened conductor layer 24C. A portion of the resist material 35C other than the region where the gate structure of the p-type transistor 2 is to be formed is removed by, for example, photolithography, and the insulating layer 26C in the region is exposed. Thereafter, the portions of the insulator layer 26C, the conductor layer 25C, and the conductor layer 24C in the pattern are removed by anisotropic etching using the pattern of the formed resist material 35C, and a gate structure is formed by the remaining portions of the insulator layer 26C, the conductor layer 25C, and the conductor layer 24C.

Next, the n$^-$ impurity diffusion region 12 is formed by a process similar to the process illustrated in FIG. 8 in the first embodiment.

Figure 24:
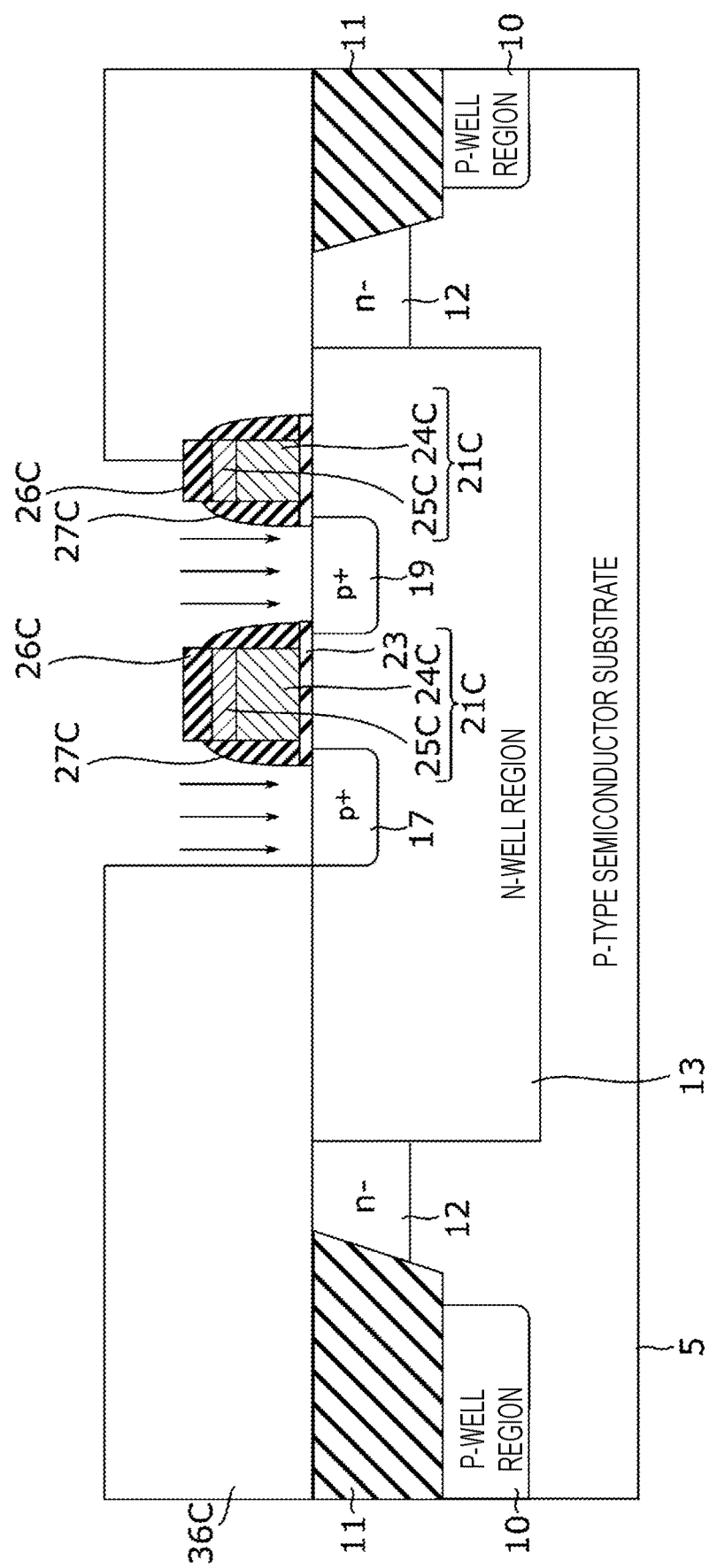
FIG. 24 is a cross-sectional view of a p-type transistor for illustrating a manufacturing process of the semiconductor device according to the fourth embodiment.

Next, as illustrated in FIG. 24, after the insulator layer 27C is formed on the inner peripheral surface and the outer peripheral surface of the gate structure and the gate insulating film 23 is removed except for the portion corresponding to the channel region, a resist material 36C is formed over the entire surface. A portion of the resist material 36C formed on the region where the p$^+$ impurity diffusion regions 17 and 19 are to be formed and on the region where the gate structure is formed is removed by, for example, photolithography, and the N-well region 13 and the insulator layers 26C and 27C are exposed. Then, p-type impurities are selectively ion-implanted into the exposed N-well region 13 to form the p$^+$ impurity diffusion regions 17 and 19. Further, the insulator layers 26C and 27C inhibit ion implantation into the gate structure. After the p$^+$ impurity diffusion regions 17 and 19 are formed, the resist material 36C is removed.

Figure 25:
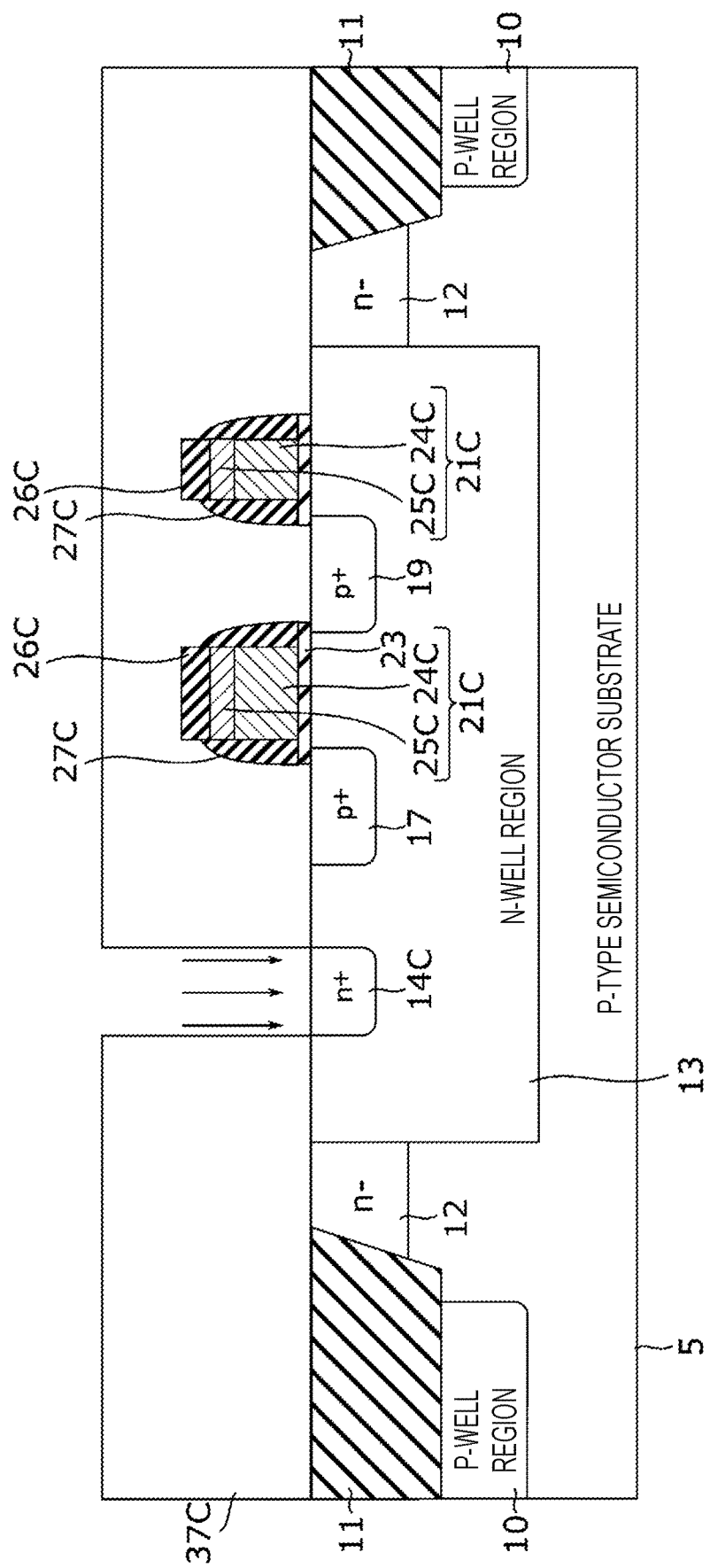
FIG. 25 is a cross-sectional view of a p-type transistor for illustrating a manufacturing process of the semiconductor device according to the fourth embodiment.

Next, as illustrated in FIG. 25, a resist material 37C is formed over the entire surface. A portion of the resist material 37C formed on the region where the n$^+$ impurity diffusion region 14C is to be formed is removed by, for example, photolithography, and the corresponding portion of the N-well region 13 is exposed. Further, the region where the n$^+$ impurity diffusion region 14C is to be formed is set between the n$^-$ impurity diffusion region 12 and the p$^+$ impurity diffusion region 17 so as to be separated from the regions.

N-type impurities are selectively ion-implanted into the exposed N-well region 13 to form the n$^+$ impurity diffusion region 14C. After the n$^+$ impurity diffusion region 14C is formed, the resist material 37C is removed.

Next, the contacts 15, 18, 20, and 22 are formed on the top surfaces of the n$^+$ impurity diffusion region 14C, the p$^+$ impurity diffusion regions 17 and 19, and the conductor layer 25C, respectively, by a process similar to the process illustrated in FIG. 11 in the first embodiment. Thereafter, the interlayer insulating film 38 is formed, and the manufacture of the p-type transistor 2 is completed.

4.3 Effect According to Present Embodiment

According to the fourth embodiment, the p$^+$ impurity diffusion region 19 is surrounded by a region where the conductor layer 21C is formed above. As a result, the p-type transistor 2 has a configuration in which the drain is surrounded by a ring-shaped channel, and it is no longer necessary to surround a portion of the p$^+$ impurity diffusion region 19 excluding the portion facing the p$^+$ impurity diffusion region 17 by the element isolation region. For this reason, the formation of the element isolation region aligned in the width direction with respect to the p$^+$ impurity diffusion region 19 may be omitted, and the element area of the p-type transistor 2 may be reduced along the width direction.

Further, the n$^+$ impurity diffusion region 14C is formed between the p$^+$ impurity diffusion region 17 without intervening an element isolation region, similarly to the n$^+$ impurity diffusion region 14B in the third embodiment. Thus, the distance between the n$^+$ impurity diffusion region 14C and the p$^+$ impurity diffusion region 17 may be shortened as compared with a case where the element isolation region is formed between the n$^+$ impurity diffusion region 14C and the p$^+$ impurity diffusion region 17. For this reason, the element area of the p-type transistor 2 may be reduced along the length direction.

In addition, since no element isolation region is formed in the N-well region 13, the n$^+$ impurity diffusion region 14C and the p$^+$ impurity diffusion region 17 are not electrically disconnected from each other. Therefore, the p-type transistor 2 according to the fourth embodiment is applicable when the source and the back gate may be set to the same potential as in the third embodiment.

5. Modifications

Further, the first to fourth embodiments described above (hereinafter, also simply referred to as the "above-described embodiments") may be variously modified.

For example, in the third embodiment described above, descriptions have been made on a case where the contact 15 is formed on the top surface of the n$^+$ impurity diffusion region 14B and the contact 18 is formed on the top surface of the p$^+$ impurity diffusion region 17. Further, in the fourth embodiment described above, descriptions have been made on a case where the contact 15 is formed on the top surface of the n$^+$ impurity diffusion region 14C and the contact 18 is formed on the top surface of the p$^+$ impurity diffusion region 17. However, the present disclosure is not limited to this, and terminals having the same potential may be commonly connected to a single contact.

Figure 26:
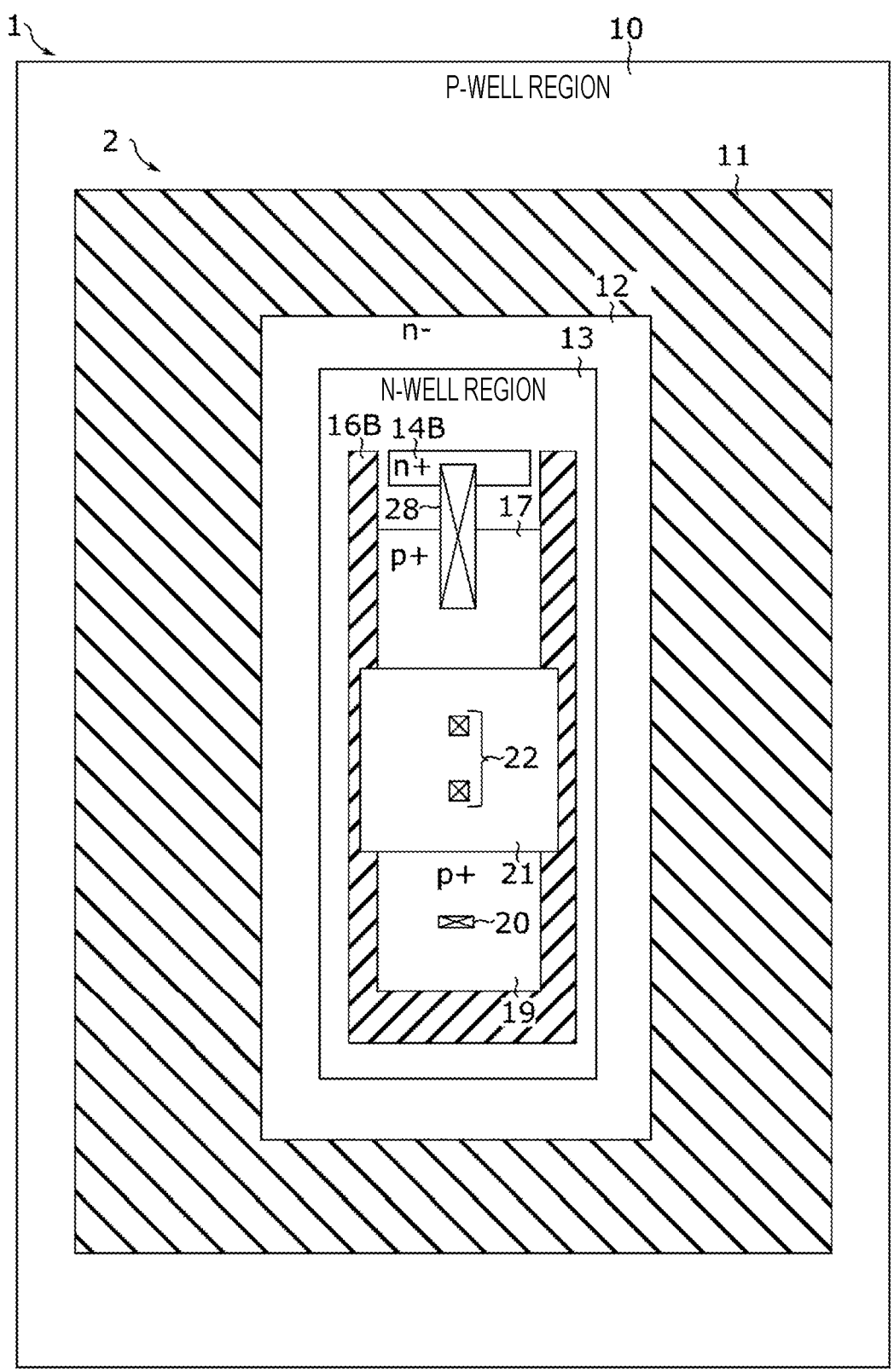
FIG. 26 is a plan view of a p-type transistor in a semiconductor device according to a modification of the third embodiment as viewed from above.
Figure 27:
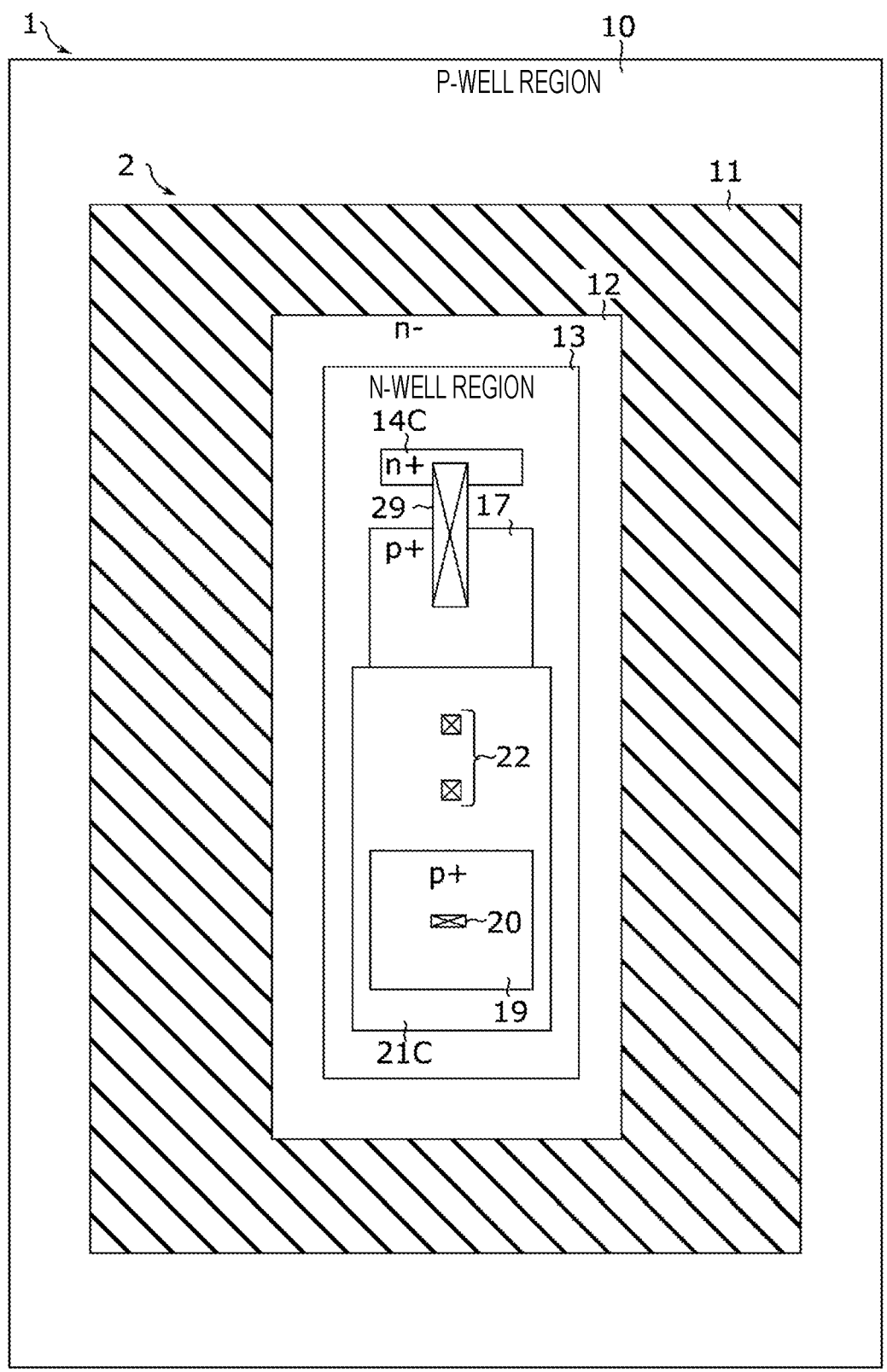
FIG. 27 is a plan view of a p-type transistor in a semiconductor device according to a modification of the fourth embodiment as viewed from above.

FIGS. 26 and 27 are plan views of p-type transistors in the semiconductor device according to modifications of the third embodiment and the fourth embodiment, as viewed from above.

As illustrated in FIG. 26, a single contact 28 may be formed to contact the top surface of the n$^+$ impurity diffusion region 14B and the top surface of the p$^+$ impurity diffusion region 17 (e.g., as shown in FIG. 16), respectively.

Further, as illustrated in FIG. 27, a single contact 29 may be formed to contact the top surface of the n$^+$ impurity diffusion region 14C and the top surface of the p$^+$ impurity diffusion region 17 (e.g., as shown in FIG. 21), respectively.

By configuring as described above, the number of contacts may be reduced by one, and the manufacturing load of the semiconductor device 1 may be reduced.

6. Application Example

An application example of the semiconductor device according to each of the above-described embodiments will be described. The semiconductor device according to each of the embodiments described above may be applied to, for example, a NAND flash memory (semiconductor storage device) that may store data in a nonvolatile manner.

6.1 Configuration of Semiconductor Storage Device

Figure 28:
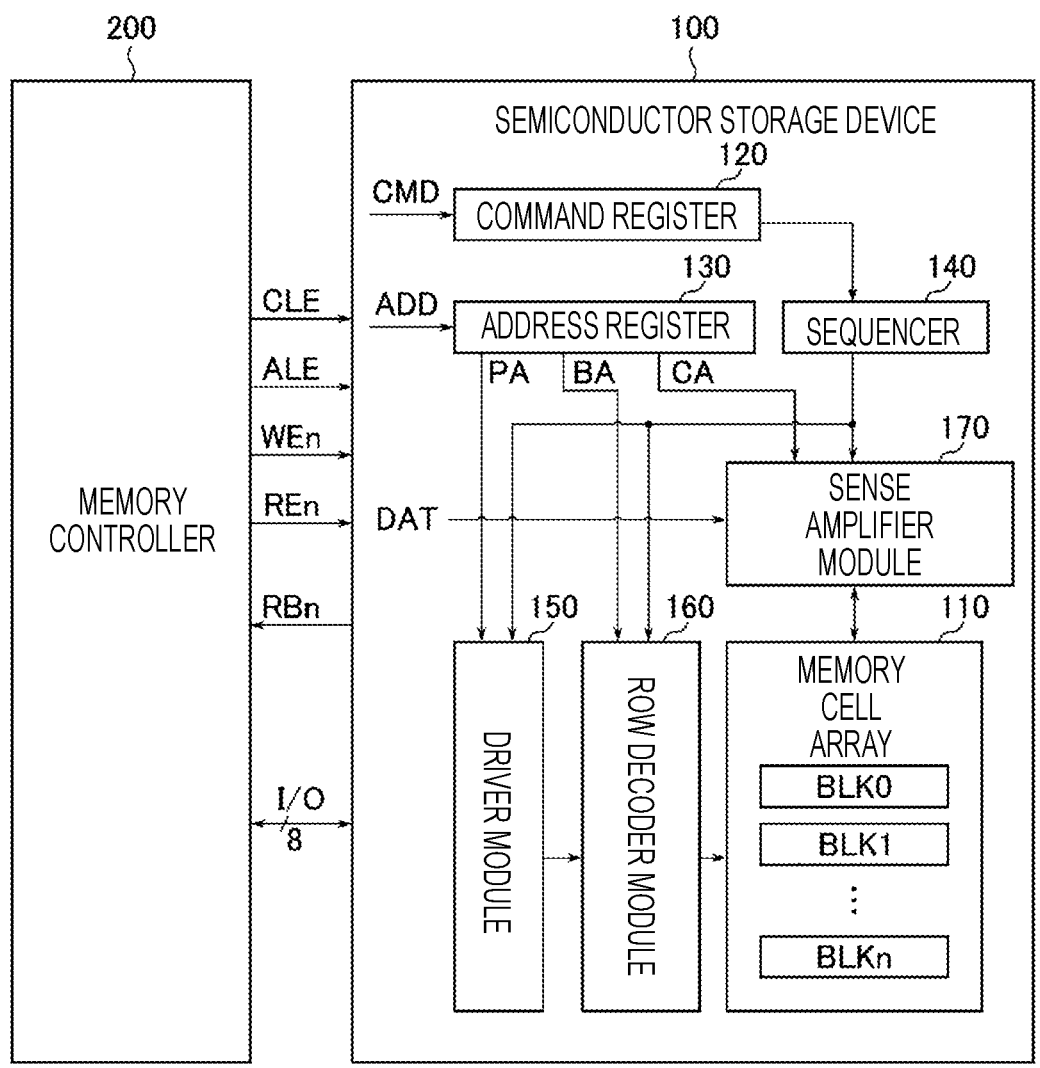
FIG. 28 is a block diagram illustrating an entire configuration of a memory system that includes a semiconductor storage device as an application example of the semiconductor device according to each of the embodiments.

FIG. 28 is a block diagram for illustrating a configuration of a semiconductor storage device according to an application example of each of the above-described embodiments. The semiconductor storage device 100 is, for example, a NAND flash memory and is controlled by an external memory controller 200. Communication between the semiconductor storage device 100 and the memory controller 200 supports, for example, the NAND interface standard.

As illustrated in FIG. 28, the semiconductor storage device 100 includes, for example, a memory cell array 110, a command register 120, an address register 130, a sequencer 140, a driver module 150, a row decoder module 160, and a sense amplifier module 170.

The memory cell array 110 includes a plurality of blocks BLK0 to BLKn (n is an integer of more than or equal to 1). The block BLK is a set of a plurality of memory cells capable of storing data in a nonvolatile manner and is used as, for example, a data erase unit. Further, the memory cell array 110 is provided with a plurality of bit lines and a plurality of word lines. Each memory cell is associated with, for example, one bit line and one word line. A detailed configuration of the memory cell array 110 will be described later.

The command register 120 stores a command CMD received from the memory controller 200 by the semiconductor storage device 100. The command CMD includes, for example, an instruction that causes the sequencer 140 to execute a read operation, a write operation, an erase operation, and the like.

The address register 130 stores address information ADD received by the semiconductor storage device 100 from the memory controller 200. The address information ADD includes, for example, a block address BA, a page address PA, and a column address CA. For example, the block address BA, the page address PA, and the column address CA are used to select a block BLK, a word line, and a bit line, respectively.

The sequencer 140 controls the entire operation of the semiconductor storage device 100. For example, the sequencer 140 controls the driver module 150, the row decoder module 160, the sense amplifier module 170, and the like based on the command CMD stored in the command register 120, and executes a read operation, a write operation, an erase operation, and the like.

The driver module 150 generates a voltage used in a read operation, a write operation, an erase operation, or the like. Then, the driver module 150 applies the generated voltage to the signal line corresponding to the selected word line based on, for example, the page address PA stored in the address register 130.

The row decoder module 160 selects one block BLK in the corresponding memory cell array 110 based on the block address BA stored in the address register 130. Then, the row decoder module 160 transfers, for example, a voltage applied to the signal line corresponding to the selected word line to the selected word line in the selected block BLK.

In the write operation, the sense amplifier module 170 applies a desired voltage to each bit line according to the write data DAT received from the memory controller 200. Further, in the read operation, the sense amplifier module 170 determines data stored in the memory cell based on the voltage of the bit line, and transfers the determination result to the memory controller 200 as read data DAT.

The semiconductor storage device 100 and the memory controller 200 described above may constitute one semiconductor device by a combination thereof. Examples of such a semiconductor device include a memory card such as an SD™ card and a solid state drive (SSD).

6.2 Configuration of Memory Cell Array

Figure 29:
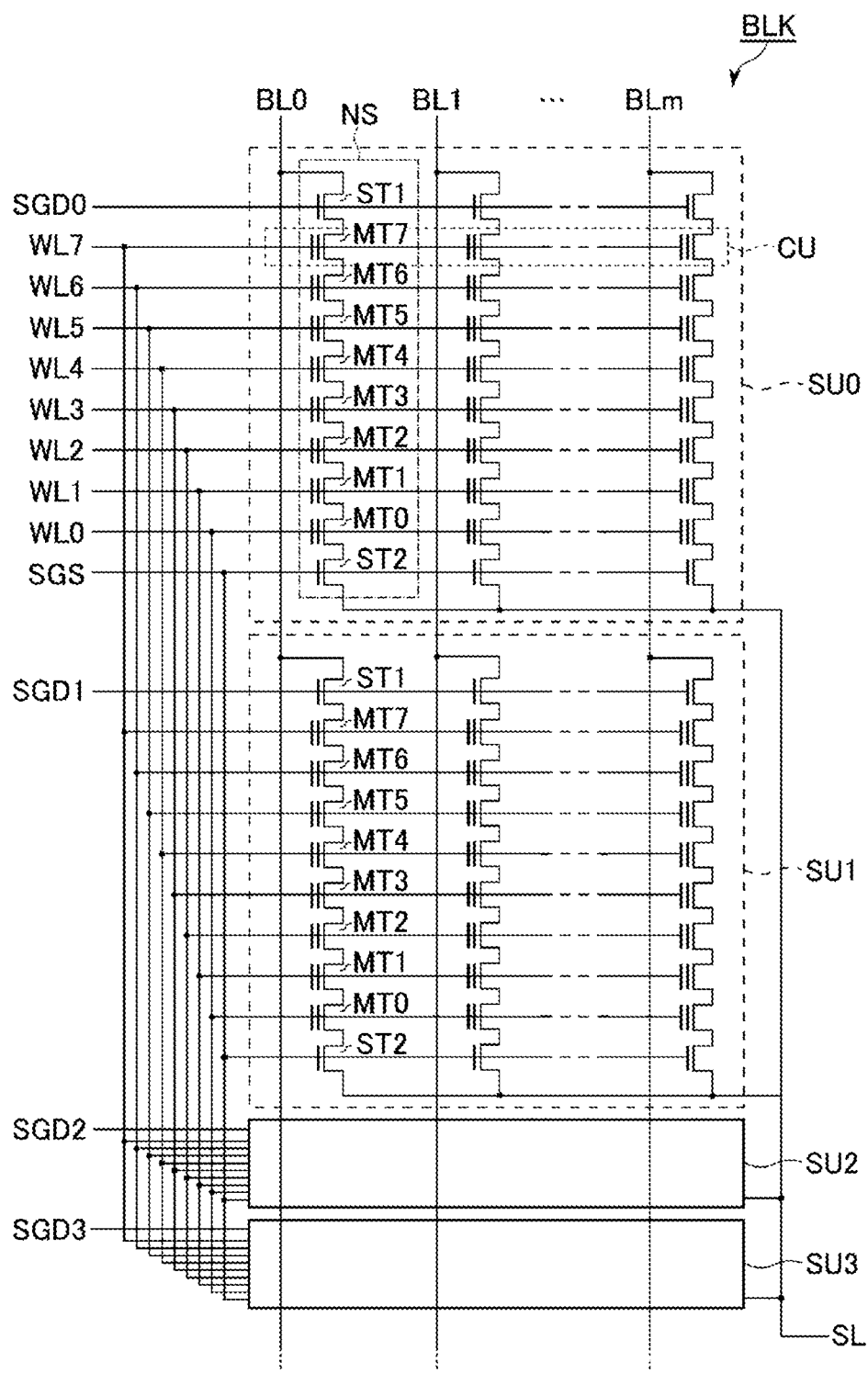
FIG. 29 is a circuit diagram illustrating a memory cell array portion in a semiconductor storage device as an application example of the semiconductor device according to each of the embodiments.

FIG. 29 is a circuit diagram for illustrating a configuration of a memory cell array of a semiconductor storage device according to an application example of each of the above-described embodiments. FIG. 29 illustrates one block BLK among a plurality of blocks BLK in the memory cell array 110.

As illustrated in FIG. 29, the block BLK includes, for example, four string units SU0 to SU3. Each string unit SU includes a plurality of NAND strings NS respectively associated with bit lines BL0 to BLm (m is an integer of more than or equal to 1). Each NAND string NS includes, for example, memory cell transistors MT0 to MT7 and select transistors ST1 and ST2. The memory cell transistor MT includes a control gate and a charge storage layer, and stores data in a nonvolatile manner. Each of the select transistors ST1 and ST2 is used to select the string unit SU during various operations.

In each NAND string NS, the memory cell transistors MT0 to MT7 are connected in series. The drain of the select transistor ST1 is connected to the associated bit line BL, and the source of the select transistor ST1 is connected to one end of the memory cell transistors MT0 to MT7 connected in series. The drain of the select transistor ST2 is connected to the other ends of the memory cell transistors MT0 to MT7 connected in series. The source of the select transistor ST2 is connected to a source line SL.

In the same block BLK, the control gates of the memory cell transistors MT0 to MT7 are commonly connected to word lines WL0 to WL7, respectively. The gates of the select transistors ST1 in the string units SU0 to SU3 are commonly connected to selected gate lines SGD0 to SGD3, respectively. The gates of the select transistors ST2 are commonly connected to a selected gate line SGS.

In the circuit configuration of the memory cell array 110 described above, the bit line BL is shared by the NAND strings NS to which the same column address is assigned in each string unit SU. For example, the source line SL is shared by a plurality of blocks BLK.

A set of a plurality of memory cell transistors MT connected to a common word line WL in one string unit SU is referred to as, for example, a cell unit CU. For example, the storage capacity of the cell unit CU including the memory cell transistors MT, each storing 1-bit data is defined as "one page data." The cell unit CU may have a storage capacity of two or more page data according to the number of bits of data stored in the memory cell transistor MT.

Further, a circuit configuration of the memory cell array 110 in the semiconductor storage device 100 according to the application example of each embodiment described above is not limited to the configuration described above. For example, the number of memory cell transistors MT and select transistors ST1 and ST2 in each NAND string NS may be designed to any number. The number of string units SU in each block BLK may be designed to any number.

6.3 Configuration of Row Decoder Module and Driver Module

Figure 30:
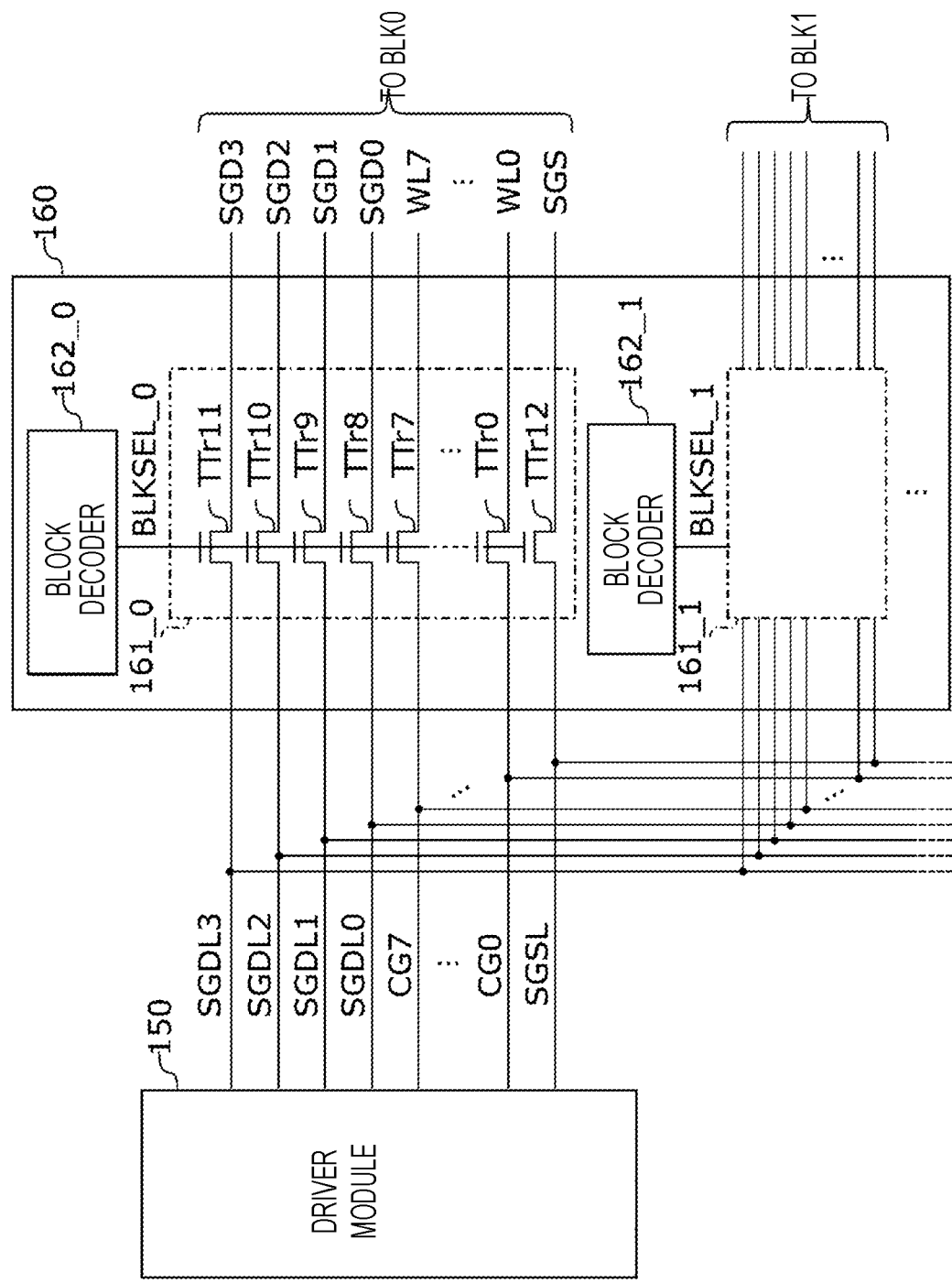
FIG. 30 is a block diagram illustrating a row decoder module and a driver module in a semiconductor storage device as an application example of the semiconductor device according to each of the embodiments.

FIG. 30 is a block diagram for illustrating the configuration of the row decoder module and the driver module of the semiconductor storage device according to the application example of each of the above-described embodiments.

As illustrated in FIG. 30, the row decoder module 160 includes a plurality of transfer switch groups 161 (161_0, 161_1, . . . ) and a plurality of block decoders 162 (162_0, 162_1, . . . ).

One transfer switch group 161 and one block decoder 162 are assigned to, for example, one block BLK. In the example of FIG. 30, the transfer switch group 161_0 and the block decoder 162_0 are assigned to block BLK0, and the transfer switch group 161_1 and the block decoder 162_1 are assigned to block BLK1. In the following description, a block BLK to be written, read, and erased is referred to as a "selected block BLK," and a block BLK other than the selected block BLK is referred to as a "non-selected block BLK."

The transfer switch group 161 includes, for example, 13 transfer transistors TTr (TTr0 to TTr12).

Each of the transfer transistors TTr0 to TTr7 transfers the voltage supplied from the driver module 150 to wiring CG (CG0 to CG7) to the word lines WL0 to WL7 of the selected block BLK. Each of the transfer transistors TTr0 to TTr7 includes a first end connected to the word lines WL0 to WL7 of the corresponding block BLK and a second end connected to the wirings CG0 to CG7.

Each of the transfer transistors TTr8 to TTr11 transfers the voltages supplied from the driver module 150 to wiring SGDL (SGDL0 to SGDL3) to the selected gate lines SGD0 to SGD3 of the selected block BLK. Each of the transfer transistors TTr8 to TTr11 includes a first end connected to the selected gate lines SGD0 to SGD3 of the corresponding block BLK and a second end connected to the wirings SGDL0 to SGDL3.

The transfer transistor TTr12 transfers the voltage supplied from the driver module 150 to wiring SGSL to the selected gate line SGS of the selected block BLK. The transfer transistor TTr12 includes a first end connected to the selected gate line SGS of the corresponding block BLK and a second end connected to the wiring SGSL.

In addition, the respective gates of the transfer transistors TTr0 to TTr12 in the transfer switch group 161_0 are commonly connected to the corresponding block decoder 162_0 via a node BLKSEL_0, and the respective gates of the transfer transistors TTr0 to TTr12 in the transfer switch group 161_1 are commonly connected to the corresponding block decoder 162_1 via a node BLKSEL_1. In this way, the respective gates of the transfer transistors TTr0 to TTr12 in the same transfer switch group 161 are commonly connected to the corresponding block decoder 162 via the same node BLKSEL.

The block decoder 162 decodes the block address signal received from the address register 130 when data is written, read, and erased. When it is determined that the block BLK corresponding to the block decoder 162 is the selected block BLK as a result of decoding, the block decoder 162 outputs an "H" level signal to the corresponding node BLKSEL. Further, when it is determined that the corresponding block BLK is not the selected block BLK, the block decoder 162 outputs an "L" level signal to the corresponding node BLKSEL. The signal output to the node BLKSEL turns on the transfer transistors TTr0 to TTr12 at the "H" level and turns off the transistors at the "L" level.

With the above configuration, for example, in the transfer switch group 161 corresponding to the selected block BLK, the transfer transistors TTr0 to TTr12 may be turned on. Thus, the word lines WL0 to WL7 are connected to the wirings CG0 to CG7, the selected gate lines SGD0 to SGD3 are connected to the wirings SGDL0 to SGDL3, respectively, and the selected gate line SGS is connected to the wiring SGSL.

Further, in the transfer switch group 161 corresponding to the non-selected block BLK, the transfer transistors TTr0 to TTr12 may be turned off. Thus, the word line WL is electrically disconnected from the wiring CG, and the selected gate lines SGD and SGS are electrically disconnected from the wirings SGDL and SGSL, respectively.

The driver module 150 supplies a voltage to the wirings CG, SGDL, and SGSL according to the address ADD received from the address register 130. The wirings CG, SGDL, and SGSL transfer various voltages supplied from the driver module 150 to each of the transfer switch groups 161_0, 161_1, . . . . That is, the voltage supplied from the driver module 150 is transferred to the word line WL, the selected gate lines SGD, and SGS in the selected block BLK via the transfer transistors TTr0 to TTr12 in the transfer switch group 161 corresponding to the selected block BLK.

6.4 Configuration of Block Decoder

Figure 31:
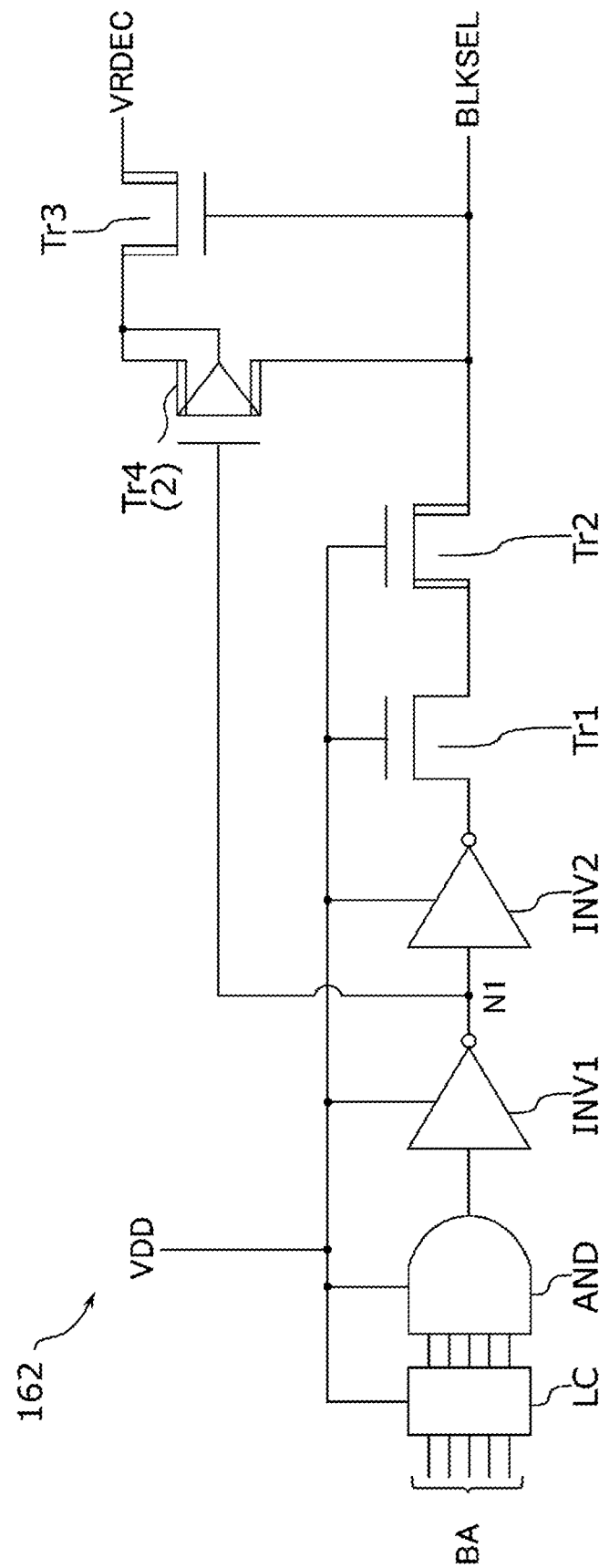
FIG. 31 is a circuit diagram illustrating a block decoder in a semiconductor storage device as an application example of the semiconductor device according to each of the embodiments.

FIG. 31 is a circuit diagram for illustrating the configuration of the block decoder of the semiconductor storage device according to the application example of each of the embodiments described above.

As illustrated in FIG. 31, the block decoder 162 includes a logic circuit LC, an AND circuit AND, inverters INV1 and INV2, n-type transistors Tr1, Tr2, and Tr3, and a p-type transistor Tr4. The n-type transistors Tr2 and Tr3 and the p-type transistor Tr4 are high breakdown voltage transistors having a thicker gate insulating film than the n-type transistor Tr1. In some embodiments, the p-type transistor Tr4 may include the p-type transistor 2, as described above.

The logic circuit LC outputs an output signal based on the block address signal BA input from the address register 130. In the logic circuit LC, all output signals are at the "H" level in the block decoder 162 where the block address signal BA is hit, and any output signal is at the "L" level in the block decoder 162 which the block address signal BA is not hit.

The AND circuit AND includes an input terminal connected to an output terminal of the logic circuit LC and an output terminal connected to the input terminal of the inverter INV1, and outputs the logical product results of the output signals from the logic circuit LC to the corresponding output terminal. The inverter INV1 includes an output terminal connected to a node N1, and outputs an inverted signal of the signal received from the AND circuit AND to the node N1. The inverter INV2 includes an input terminal connected to the node N1, and an output terminal connected to a first end of an n-type transistor Tr1. The inverter INV2 outputs an inverted signal of the signal received from the inverter INV1 (i.e., a signal output from the AND circuit AND) to the first end of the n-type transistor Tr1. Further, the logic circuit LC, the AND circuit AND, and the inverters INV1 and INV2 are driven by a power supply voltage VDD.

The n-type transistor Tr1 includes a second end connected to the first end of the n-type transistor Tr2, and a gate to which the power supply voltage VDD is supplied. The n-type transistor Tr2 includes a second end connected to the node BLKSEL and a gate to which the power supply voltage VDD is supplied. The n-type transistors Tr1 and Tr2 may be turned on by a power supply voltage VDD.

The n-type transistor Tr3 includes a first end connected to a node VRDEC, a second end connected to the first end of the p-type transistor Tr4, and a gate connected to the node BLKSEL. The voltage supplied to the node VRDEC is, for example, a high voltage that may be transferred to the word line WL or the like without the transfer switch group 161 illustrated in FIG. 30 clamping the voltage of the wiring CG or the like. The p-type transistor Tr4 includes a second end connected to the node BLKSEL, a back gate connected to the second end of the n-type transistor Tr3 together with the first end of the p-type transistor Tr4, and a gate connected to the node N1.

With the above configuration, the block decoder 162 may output an "H" level signal to the node BLKSEL when the corresponding block BLK is selected, and output an "L" level signal when the corresponding block BLK is not selected.

Specifically, when the block address signal BA is hit in the logic circuit LC, the block decoder 162 outputs an "L" level signal to the node N1 and an "H" level signal to the node BLKSEL. Accordingly, the p-type transistor Tr4 is turned on and the n-type transistor Tr3 is weakly turned on, the voltage of the node VRDEC clamped by the n-type transistor Tr3 is transferred to the node BLKSEL, and the voltage of the node BLKSEL increases. The n-type transistor Tr3 is turned on more strongly by the increased voltage of the node BLKSEL, and a higher voltage may be transferred to the node BLKSEL. By repeating the above operation, the level of the node BLKSEL is shifted to the voltage supplied to the node VRDEC.

In addition, when the block address signal BA is not hit in the logic circuit LC, the block decoder 162 outputs an "H" level signal to the node N1 and an "L" level signal to the node BLKSEL. Accordingly, the n-type transistor Tr3 and the p-type transistor Tr4 are turned off, and the transfer switch group 161 electrically disconnects the wiring CG and the like from the word line WL and the like by the voltage supplied to the node BLKSEL.

6.5 Effect According to Application Example

In the block decoder 162, in order to transfer a high voltage to the node BLKSEL, the n-type transistors Tr2 and Tr3 and the p-type transistor Tr4 are designed to have a higher breakdown voltage than the n-type transistor Tr1, and the transistors are formed to be adjacent to each other on a substrate. In such a case, as described above, due to the manufacturing process of the n-type transistors Tr2 and Tr3, there is a possibility that a path may be formed in which the $p^+$ impurity diffusion regions in the n-type transistors Tr2 and Tr3 and the N-well region in the p-type transistor Tr4 are electrically connected through the lower portion of the element isolation region formed between the n-type transistors Tr2 and Tr3 and the p-type transistor Tr4. The path shall be blocked in order not to deteriorate the breakdown voltage characteristic of the N-well region of the p-type transistor Tr4.

According to the application example in which the p-type transistor 2 of each of the above embodiments is applied to the p-type transistor Tr4, the N-well region 13 is surrounded by the n− impurity diffusion region 12. For this reason, since the path where the N-well region 13 and the $p^+$ impurity diffusion region in the adjacent n-type transistor are electrically connected via the lower portion of the insulator layer 11 may be cut off, it is possible to prevent the deterioration of the breakdown voltage characteristic of the N-well region 13. Further, the voltages of the $n^−$ impurity diffusion region 12 and the N-well region 13 are collectively controlled via the contact 15 formed on the $n^+$ impurity diffusion region 14. Therefore, the element isolation region formed along the length direction may be omitted as compared with a case where the voltages of the $n^−$ impurity diffusion region 12 and the N-well region 13 are controlled via separate $n^+$ impurity diffusion regions. Therefore, it is possible to reduce the area of the p-type transistor Tr4 while preventing the deterioration of the breakdown voltage characteristic of the N-well region 13.

Further, since the p-type transistor Tr4 has a configuration in which the source and the back gate are commonly connected to the second end of the n-type transistor Tr3, the p-type transistor 2 according to the third embodiment and the fourth embodiment is applicable to the application example. Thus, an element area reduction effect equivalent to that of the third embodiment and the fourth embodiment may be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate including:
        two first semiconductor regions of a first conductivity type spaced apart from each other in a first direction along an upper surface of the substrate;
        a first insulator region provided along the upper surface of the substrate and surrounding the two first semiconductor regions;
        a second semiconductor region of a second conductivity type including a first portion, a second portion, a third portion, and a fourth portion, wherein the first portion is provided between the two first semiconductor regions, the second portion is provided below lower surfaces of the two semiconductor regions, the third portion is provided below a lower surface of the first insulator region, and the fourth portion is provided next to the first insulator region along the upper surface of the substrate;

a third semiconductor region of the second conductivity type provided in the fourth portion of the second semiconductor region along the upper surface of the substrate;

a fourth semiconductor region of the second conductivity type, the fourth semiconductor region provided along the upper surface of the substrate, surrounding the second semiconductor region and having an impurity concentration of the second conductivity type lower than an impurity concentration of the third semiconductor region; and a second insulator region provided along the upper surface of the substrate and surrounding the fourth semiconductor region;

a conductor layer provided above the first portion of the second semiconductor region;

two first contact plugs respectively provided on the two first semiconductor regions;

a second contact plug provided on the conductor layer; and a third contact plug provided on the third semiconductor region.

2. The semiconductor device according to claim 1, wherein the third semiconductor region is separated from the second insulator region.

3. The semiconductor device according to claim 1, wherein one of the two first semiconductor regions is spaced apart from the third semiconductor region.

4. The semiconductor device according to claim 3, wherein at least a portion of the first insulator region, together with the second semiconductor region, surround the other of the two first semiconductor regions.

5. The semiconductor device according to claim 3, wherein the conductor layer is provided over the first portion of the second semiconductor region that at least partially surrounds the other of the two first semiconductor regions.

6. The semiconductor device according to claim 3, further comprising:

a first transistor of the first conductivity type which is provided along the upper surface of the substrate and includes the two first semiconductor regions and the conductor layer; and a second transistor and a third transistor, each of which is provided along the upper surface of the substrate and has the second conductivity type, wherein the first transistor includes a first end electrically connected to a first end of the second transistor and a gate of the third transistor, a second end electrically connected to a first end of the third transistor, and a back gate.

* * * * *